United States Patent
Kim

(10) Patent No.: US 9,209,234 B2
(45) Date of Patent: Dec. 8, 2015

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventor: Jeong-Hun Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 195 days.

(21) Appl. No.: 13/952,511

(22) Filed: Jul. 26, 2013

(65) Prior Publication Data

US 2014/0239266 A1    Aug. 28, 2014

(30) Foreign Application Priority Data

Feb. 28, 2013    (KR) .................. 10-2013-0022445

(51) Int. Cl.
  *H01L 51/52*    (2006.01)
  *H01L 27/32*    (2006.01)
  *H01L 51/00*    (2006.01)

(52) U.S. Cl.
  CPC ........ *H01L 27/3246* (2013.01); *H01L 51/0013* (2013.01); *H01L 51/5209* (2013.01); *H01L 27/3211* (2013.01); *H01L 2251/5315* (2013.01)

(58) Field of Classification Search
  CPC ..................................................... H01L 51/52
  See application file for complete search history.

(56) References Cited

U.S. PATENT DOCUMENTS

| 7,205,716 B2* | 4/2007 | Yamazaki et al. ............ 313/509 |
| 2010/0066952 A1* | 3/2010 | Tsuchiya et al. .............. 349/106 |
| 2011/0215305 A1* | 9/2011 | Kim et al. ....................... 257/40 |
| 2011/0229994 A1 | 9/2011 | Jung |
| 2012/0001185 A1 | 1/2012 | Lee et al. |

FOREIGN PATENT DOCUMENTS

| KR | 10-2007-0055908 | 5/2007 |
| KR | 10-2007-0065647 | 6/2007 |
| KR | 10-2011-0109049 | 10/2011 |
| KR | 10-2012-0002467 | 1/2012 |

* cited by examiner

*Primary Examiner* — Lex Malsawma
(74) *Attorney, Agent, or Firm* — Christie, Parker & Hale, LLP

(57) ABSTRACT

An organic light-emitting display apparatus whose defect rate is significantly decreased in a manufacturing procedure includes a substrate having a first sub-pixel region, a second sub-pixel region, and a third sub-pixel region; and a planarization layer covering the first sub-pixel region, the second sub-pixel region, and the third sub-pixel region, such that a distance between the substrate and a top surface of the planarization layer at the center of the first sub-pixel region is greater than a distance between the substrate and the top surface of the planarization layer at the center of the second sub-pixel region or a distance between the substrate and the top surface of the planarization layer at the center of the third sub-pixel region. A method of manufacturing the organic light-emitting display apparatus is also disclosed.

20 Claims, 12 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims priority to and the benefit of Korean Patent Application No. 10-2013-0022445, filed on Feb. 28, 2013, in the Korean Intellectual Property Office, the content of which is incorporated herein in its entirety by reference.

BACKGROUND

1. Field

The following description relates to an organic light-emitting display apparatus and a method of manufacturing the organic light-emitting display apparatus, and more particularly, to an organic light-emitting display apparatus of which a defect rate is significantly decreased in a manufacturing procedure and a method of manufacturing the organic light-emitting display apparatus.

2. Description of the Related Art

An organic light-emitting display apparatus refers to a display apparatus having sub-pixels, each sub-pixel having an organic light-emitting device (OLED) that includes two electrodes facing each other and an intermediate layer interposed between the electrodes and the intermediate layer including an emission layer (EML). The organic light-emitting display apparatus controls emission of each sub-pixel and the amount of emission from each sub-pixel by using a thin film transistor (TFT). In general, an organic light-emitting display apparatus has a plurality of TFTs that are disposed on a substrate, and an OLED positioned on each TFT and electrically connected thereto.

However, the manufacturing process of a conventional organic light-emitting display apparatus has problems of high defect rate when an intermediate layer of each sub-pixel is formed, or when each sub-pixel has to be formed via a complicated procedure. For example, in order to deposit different emission materials on the respective sub-pixel regions, a mask having small through holes corresponding to the sub-pixels is used. However, as the resolution of the organic light-emitting display apparatus is increased, the through holes in the mask become smaller and more densely disposed, which makes the deposition of the emission materials more difficult and the deposition may not be accurately performed.

SUMMARY

Aspects of the present invention are directed toward an organic light-emitting display apparatus of which a defect rate is significantly decreased in a manufacturing procedure and a method of manufacturing the organic light-emitting display apparatus. However, it will be understood by those of ordinary skill in the art that various changes in form and details may be made therein without departing from the spirit and scope of the present invention.

According to an embodiment of the present invention, an organic light-emitting display apparatus includes a substrate having a first sub-pixel region, a second sub-pixel region, and a third sub-pixel region; a planarization layer that covers the first sub-pixel region, the second sub-pixel region, and the third sub-pixel region, such that a distance between the substrate and a top surface of the planarization layer at the center of the first sub-pixel region is greater than a distance between the substrate and the top surface of the planarization layer at the center of the second sub-pixel region or a distance between the substrate and the top surface of the planarization layer at the center of the third sub-pixel region; and a first sub-pixel electrode disposed on the planarization layer in the first sub-pixel region, a second sub-pixel electrode disposed on the planarization layer in the second sub-pixel region, and a third sub-pixel electrode disposed on the planarization layer in the third sub-pixel region.

The organic light-emitting display apparatus may further include a pixel-defining layer (PDL) that is disposed on the planarization layer and extends over the first sub-pixel region and the second sub-pixel region and over the second sub-pixel region and the third sub-pixel region so as to cover edges of the first sub-pixel electrode, the second sub-pixel electrode, and the third sub-pixel electrode.

A distance between the substrate and a top surface of a portion of the PDL that extends over the first sub-pixel region and the second sub-pixel region so as to cover the edge of the first sub-pixel electrode and the edge of the second sub-pixel electrode may be equal to a distance between the substrate and a top surface of a portion of the PDL that extends over the second sub-pixel region and the third sub-pixel region so as to cover the edge of the second sub-pixel electrode and the edge of the third sub-pixel electrode.

The planarization layer may be formed such that a distance between the substrate and the top surface of the planarization layer at the center of the first sub-pixel region may be greater than a distance between the substrate and a top surface of the planarization layer at an edge of the first sub-pixel region.

The first sub-pixel electrode may cover at least a portion of the top surface of the planarization layer at the edge of the first sub-pixel region and may cover the top surface of the planarization layer at the center of the first sub-pixel region.

The portion of the PDL that extends over the first sub-pixel region and the second sub-pixel region may cover a portion of the first sub-pixel electrode at the edge of the first sub-pixel region.

The first sub-pixel electrode may be disposed on the top surface of the planarization layer at the center of the first sub-pixel region.

At the portion of the PDL that extends over the first sub-pixel region and the second sub-pixel region, a distance between the top surface of the PDL and a top surface of a portion of the second sub-pixel electrode covered by the PDL may be greater than a distance between the top surface of the PDL and a top surface of a portion of the first sub-pixel electrode covered by the PDL.

The organic light-emitting display apparatus may further include a second emission layer (second EML) that is disposed on the top surface of the portion of the PDL that extends over the first sub-pixel region and the second sub-pixel region, on at least a portion of the second sub-pixel electrode that is not covered by the PDL, and on the top surface of the portion of the PDL that extends over the second sub-pixel region and the third sub-pixel region; and a first EML that is disposed on a top surface of the second EML on the top surface of the portion of the PDL that extends over the first sub-pixel region and the second sub-pixel region, on at least a portion of the first sub-pixel electrode that is not covered by the PDL, and on a top surface of the second EML on the top surface of the portion of the PDL that extends over the second sub-pixel region and the third sub-pixel region.

A step difference between a top surface of the second EML on the portion of the PDL that extends over the first sub-pixel region and the second sub-pixel region and a top surface of the center of the first sub-pixel electrode may be equal to a step difference between a bottom surface of the second EML on the portion of the PDL that extends over the first sub-pixel region and the second sub-pixel region and a top surface of the center of the second sub-pixel electrode.

The organic light-emitting display apparatus may further include a third EML that is interposed between the second EML and the PDL, between the second EML and the second sub-pixel electrode, between the first EML and the PDL, and between the first EML and the first sub-pixel electrode, and that covers at least a portion of the third sub-pixel electrode that is not covered by the PDL.

According to another embodiment of the present invention, a method of manufacturing an organic light-emitting display apparatus includes operations of preparing a substrate having a first sub-pixel region, a second sub-pixel region, and a third sub-pixel region; forming a planarization layer that covers the first sub-pixel region, the second sub-pixel region, and the third sub-pixel region, such that a distance between the substrate and a top surface of the planarization layer at the center of the first sub-pixel region is greater than a distance between the substrate and the top surface of the planarization layer at the center of the second sub-pixel region or a distance between the substrate and the top surface of the planarization layer at the center of the third sub-pixel region; and forming a first sub-pixel electrode disposed on the planarization layer in the first sub-pixel region, a second sub-pixel electrode disposed on the planarization layer in the second sub-pixel region, and a third sub-pixel electrode disposed on the planarization layer in the third sub-pixel region.

The method may further include an operation of forming a pixel-defining layer (PDL) that is disposed on the planarization layer and that extends over the first sub-pixel region and the second sub-pixel region and over the second sub-pixel region and the third sub-pixel region so as to cover edges of the first sub-pixel electrode, the second sub-pixel electrode, and the third sub-pixel electrode.

The operation of forming the PDL may be performed such that a distance between the substrate and a top surface of a portion of the PDL that extends over the first sub-pixel region and the second sub-pixel region so as to cover the edge of the first sub-pixel electrode and the edge of the second sub-pixel electrode may be equal to a distance between the substrate and a top surface of a portion of the PDL that extends over the second sub-pixel region and the third sub-pixel region so as to cover the edge of the second sub-pixel electrode and the edge of the third sub-pixel electrode.

The operation of forming the PDL may be performed such that a distance between the substrate and the top surface of the planarization layer at the center of the first sub-pixel region may be greater than a distance between the substrate and the top surface of the planarization layer at an edge of the first sub-pixel region.

The first sub-pixel electrode may cover at least a portion of the top surface of the planarization layer at the edge of the first sub-pixel region and may cover the top surface of the planarization layer at the center of the first sub-pixel region.

The operation of forming the PDL may be performed such that the portion of the PDL that extends over the first sub-pixel region and the second sub-pixel region may cover a portion of the first sub-pixel electrode at the edge of the first sub-pixel region.

The method may further include operations of forming a second emission layer (second EML) that is disposed on the top surface of the portion of the PDL that extends over the first sub-pixel region and the second sub-pixel region, on at least a portion of the second sub-pixel electrode that is not covered by the PDL, and on the top surface of the portion of the PDL that extends over the second sub-pixel region and the third sub-pixel region; and forming a first EML that is disposed on a top surface of the second EML on the top surface of the portion of the PDL that extends over the first sub-pixel region and the second sub-pixel region, on at least a portion of the first sub-pixel electrode that is not covered by the PDL, and on a top surface of the second EML on the top surface of the portion of the PDL that extends over the second sub-pixel region and the third sub-pixel region.

A step difference between a top surface of the second EML on the portion of the PDL that extends over the first sub-pixel region and the second sub-pixel region and a top surface of the center of the first sub-pixel electrode may be equal to a step difference between a bottom surface of the second EML on the portion of the PDL that extends over the first sub-pixel region and the second sub-pixel region and a top surface of the center of the second sub-pixel electrode.

The method may further include an operation of forming a third EML that covers a portion of the first sub-pixel electrode that is not covered by the PDL, a portion of the second sub-pixel electrode that is not covered by the PDL, a portion of the third sub-pixel electrode that is not covered by the PDL, and the top surface of the PDL.

BRIEF DESCRIPTION OF THE DRAWINGS

The above and other features and advantages of the present invention will become more apparent by describing in more detail example embodiments thereof with reference to the attached drawings in which.

DETAILED DESCRIPTION

Figure 1:
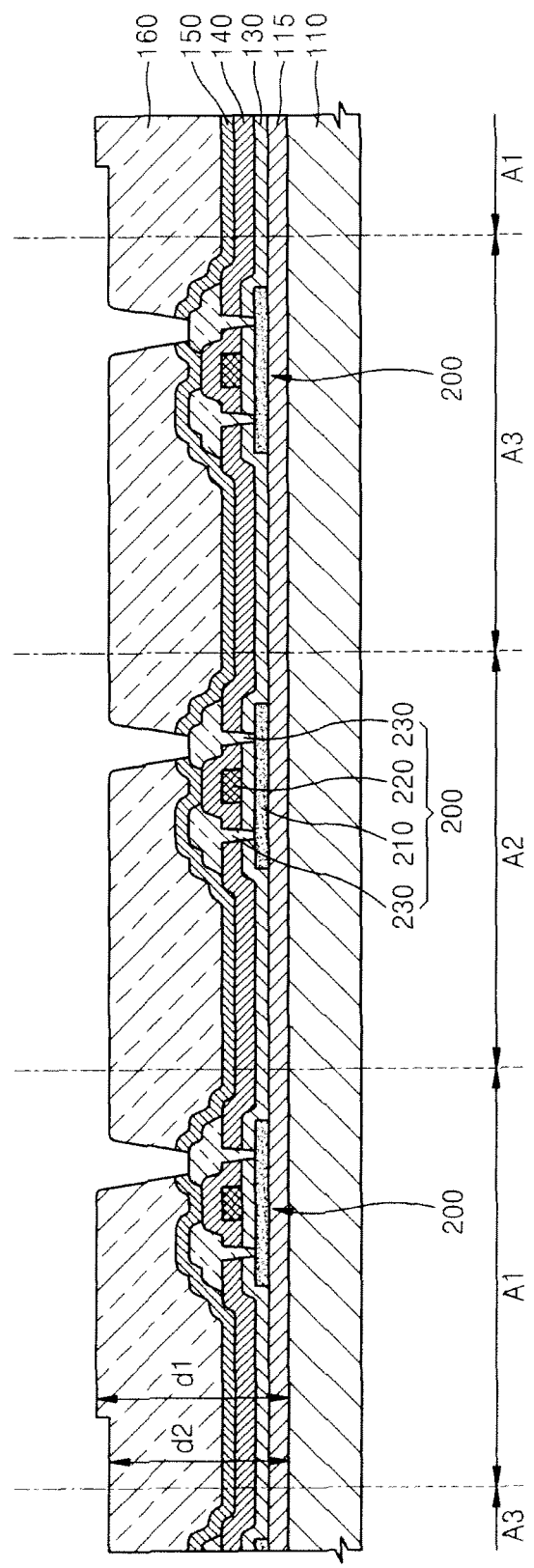
FIGS. 1 through 8 are cross-sectional views illustrating various acts of a process of manufacturing an organic light-emitting display apparatus, according to an embodiment of the present invention.

The present invention will now be described in more detail with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art. In the drawings, the thicknesses of layers and regions may be exaggerated or reduced for clarity. For example, the thicknesses and sizes of elements in the drawings are arbitrarily shown for the convenience of description, thus, the spirit and scope of the present invention are not necessarily defined by the drawings.

Throughout the specification, it will also be understood that when an element such as a layer, film, region, or substrate is referred to as being "on" another element, it can be directly on the other element, or intervening elements may also be present.

As used herein, the term "and/or" includes any and all combinations of one or more of the associated listed items. Expressions such as "at least one of," when preceding a list of elements, modify the entire list of elements and do not modify the individual elements of the list.

FIGS. 1 through 8 are cross-sectional views illustrating various acts of a process of manufacturing an organic light-emitting display apparatus according to an embodiment of the present invention.

According to the method of manufacturing the organic light-emitting display apparatus, first, a substrate 110 is provided. The substrate 110 has a first sub-pixel region A1, a second sub-pixel region A2, and a third sub-pixel region A3. A set of the first sub-pixel region A1, the second sub-pixel region A2, and the third sub-pixel region A3 may constitute one pixel region. The substrate 110 may have a plurality of pixel regions. In one embodiment, the first sub-pixel region A1 is a region in which a sub-pixel that emits red light is to be formed, the second sub-pixel region A2 is a region in which a sub-pixel that emits green light is to be formed, and the third sub-pixel region A3 may be a region in which a sub-pixel that emits blue light is to be formed. Here, according to a structure of the organic light-emitting display apparatus, the first sub-pixel region A1 and the second sub-pixel region A2 may be regions in which sub-pixels that emit blue-mixed light are to be formed.

The substrate 110 may be formed of various suitable materials such as a glass material, a metal material, or a plastic material including polyethylene terephthalate (PET), polyethylene naphthalate (PEN), polyimide, or the like. A thin film transistor (TFT) 200 may be disposed on the substrate 110. In one embodiment, another layer such as a buffer layer 115 is formed on the substrate 110 before the TFT 200 is formed. As illustrated, the buffer layer 115 may be formed on an entire surface of the substrate 110 or may be formed by being patterned.

The buffer layer 115 may have a structure in which various suitable materials including PET, PEN, polyacrylate, polyimide, and/or the like are stacked in single or multiple layered arrangements. Here, the buffer layer 115 may be formed of silicon oxide or silicon nitride, or may be formed as a composite layer including an organic material and/or an inorganic material.

The TFT 200 may control the emission of each sub-pixel or may control the amount of emission when each sub-pixel emits light. The TFT 200 may include a semiconductor layer 210, a gate electrode 220, and source/drain electrodes 230.

The semiconductor layer 210 may be formed of an amorphous silicon layer, an oxide silicon layer, or a polycrystalline silicon layer, or may be formed of an organic semiconductor material. In one embodiment, the semiconductor layer 210 includes a source region and a drain region which are doped with dopants, and a channel region.

The semiconductor layer 210 may be covered with a gate insulating layer 130, and the gate electrode 220 may be disposed on the gate insulating layer 130. In general, the gate insulating layer 130 may cover an entire surface of the substrate 110. In one embodiment, the gate insulating layer 130 is formed by being patterned. In consideration of adhesion to an adjacent layer, and surface planarization and formability of a stack target layer, the gate insulating layer 130 may be formed of silicon oxide, silicon nitride, or other insulating organic or inorganic materials. The gate electrode 220 may be formed of a single or a composite material layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), or a suitable alloy thereof.

The gate electrode 220 and the gate insulating layer 130 may be covered by an interlayer insulating layer 140 that is formed of silicon oxide, silicon nitride, and/or other suitable insulating organic or inorganic materials. In this regard, portions of the gate insulating layer 130 and the interlayer insulating layer 140 may be removed, and contact holes are formed after the removal to expose predetermined regions of the semiconductor layer 210. The source/drain electrodes 230 may contact the semiconductor layer 210 via the contact holes. In consideration of conductivity, the source/drain electrode 230 may be formed of a single or a composite material layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), or a suitable alloy thereof.

The TFT 200 may be covered by a protective layer 150 that is formed of silicon oxide, silicon nitride, and/or other suitable insulating organic or inorganic materials. The protective layer 150 covers an entire or partial portion of the substrate 110. As illustrated, since the TFT 200 having a complicated layer structure is disposed below the protective layer 150, a top surface of the protective layer 150 may not be sufficiently planar. Thus, as illustrated, it is necessary to form a planarization layer 160 on the protective layer 150 so that the protective layer 150 may have a sufficiently planar top surface.

The planarization layer 160 covers the first sub-pixel region A1, the second sub-pixel region A2, and the third sub-pixel region A3. Here, the planarization layer 160 is formed so that a top surface of the planarization layer 160 at a center of the first sub-pixel region A1 is more distant away from the substrate 110 than the top surface of the planarization layer 160 at centers of the second sub-pixel region A2 and the third sub-pixel region A3, respectively. That is, as illustrated, the planarization layer 160 is formed so that a distance d1 between a top surface of the substrate 110 and the top surface of the planarization layer 160 at the center of the first sub-pixel region A1 is greater than a distance d2 between the top surface of the substrate 110 and the top surface of the planarization layer 160 at the center of one of the second and third sub-pixel regions A2 and A3.

The planarization layer 160 may be formed by using various suitable methods. For example, a planarization layer may be formed while allowing distances between the top surface of the substrate 110 and the centers of the first, second, and third sub-pixel regions A1, A2, and A3 to be equal, and then additional material layer for planarization layer may be formed on the center of the first sub-pixel region A1. Alternatively, the planarization layer 160 may be formed to allow the distances between the top surface of the substrate 110 and the centers of the first, second, and third sub-pixel regions A1, A2, and A3 to be equal, and then portions other than the center of the first sub-pixel region A1 may be exposed and removed. Here, when the planarization layer 160 is formed by performing deposition once by using a halftone mask, the planarization layer 160 may be formed while allowing the distance d1 between the top surface of the substrate 110 and the center of the first sub-pixel region A1 to be greater than the distance d2 between the top surface of the substrate 110 and the center of one of the second and third sub-pixel regions A2 and A3, as illustrated in FIG. 1.

After the planarization layer 160 is formed, a via hole may be formed in the protective layer 150 and the planarization layer 160 so as to expose one of the source/drain electrodes 230 of the TFT 200, as illustrated in FIG. 1.

Figure 2:
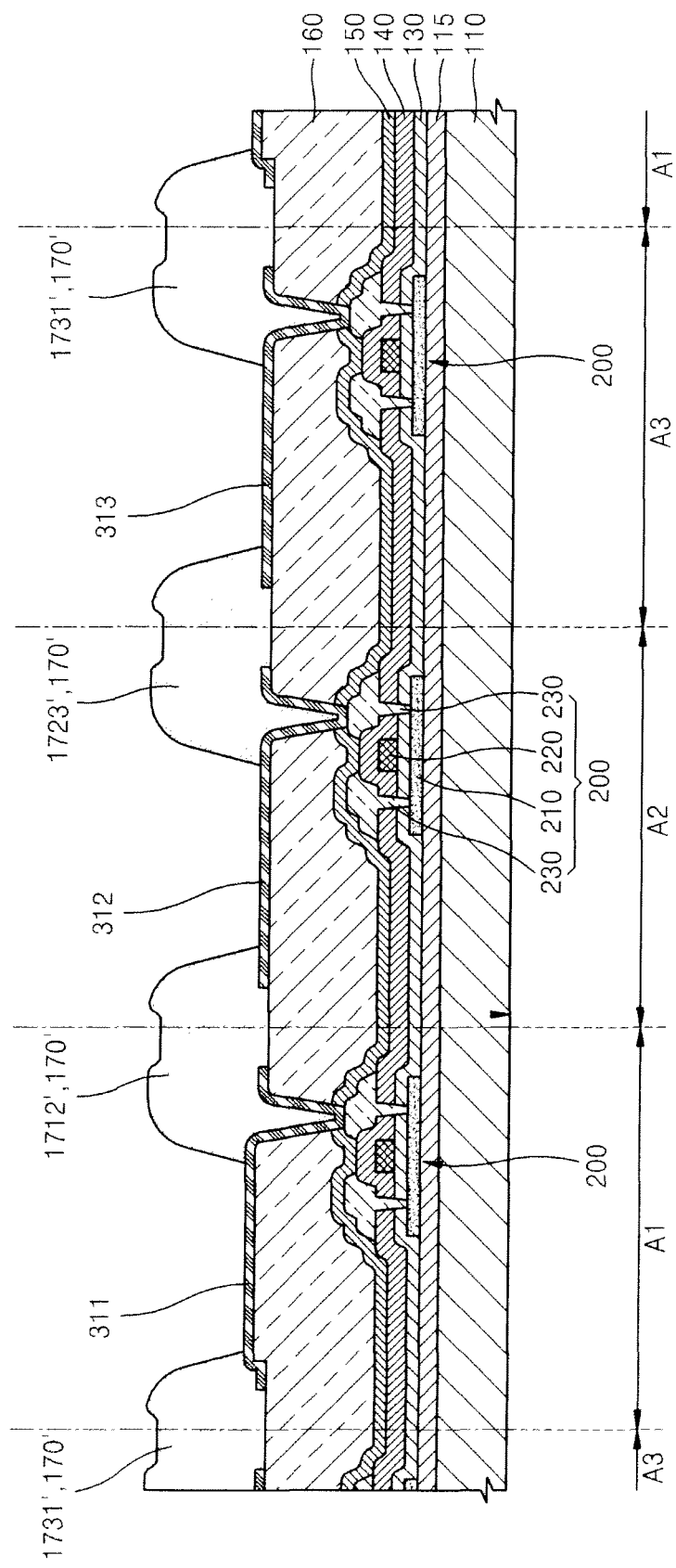

Afterward, as illustrated in FIG. 2, a first sub-pixel electrode 311, a second sub-pixel electrode 312, and a third sub-pixel electrode 313 are formed on the planarization layer 160. The first sub-pixel electrode 311 is formed in the first sub-pixel region A1, the second sub-pixel electrode 312 is formed in the second sub-pixel region A2, and the third sub-pixel electrode 313 is formed in the third sub-pixel region A3. Here, the first sub-pixel electrode 311, the second sub-pixel electrode 312, and the third sub-pixel electrode 313 may be simultaneously or currently formed. Each of the first sub-pixel electrode 311, the second sub-pixel electrode 312, and the third sub-pixel electrode 313 may be electrically connected to the TFT 200 via the via hole.

Each of the first sub-pixel electrode 311, the second sub-pixel electrode 312, and the third sub-pixel electrode 313 may be formed as a transparent (transflective) electrode or a reflective electrode. When the first sub-pixel electrode 311, the second sub-pixel electrode 312, and the third sub-pixel electrode 313 are formed as the transparent (transflective) electrodes, they may be formed of indium tin oxide (ITO), indium zinc oxide (IZO), zinc oxide (ZnO), indium oxide ($In_2O_3$), indium gallium oxide (IGO), or aluminum zinc oxide (AZO). When the first sub-pixel electrode 311, the second sub-pixel electrode 312, and the third sub-pixel electrode 313 are formed as the reflective electrodes, they may include a reflective layer formed of Ag, Mg, Al, Pt, Pd, Au, Ni, Nd, Ir, Cr or a compound material of any of these, and a layer formed of ITO, IZO, ZnO or $In_2O_3$. Here, configurations and materials of the first sub-pixel electrode 311, the second sub-pixel electrode 312, and the third sub-pixel electrode 313 are not limited thereto and may vary.

According to the method of manufacturing the organic light-emitting display apparatus of the present embodiment, as described above, the planarization layer 160 is formed so that the distance d1 between the top surface of the substrate 110 and the top surface of the planarization layer 160 at the center of the first sub-pixel region A1 is greater than the distance d2 between the top surface of the substrate 110 and the top surface of the planarization layer 160 at the center of one of the second and third sub-pixel regions A2 and A3. Thus, a distance between the substrate 110 and a top surface of a center region of the first sub-pixel electrode 311 formed in the first sub-pixel region A1 is greater than a distance between the substrate 110 and a top surface of a center region of the second sub-pixel electrode 312 formed in the second sub-pixel region A2 or is greater than a distance between the substrate 110 and a top surface of a center region of the third sub-pixel electrode 313 formed in the third sub-pixel region A3. The aforementioned feature may be a basis for reducing the occurrence of defects in the first sub-pixel region A1 and the second sub-pixel region A2, when an emission layer (EML) is formed or an intermediate layer including the EML is formed, as will be described later.

Figure 3:
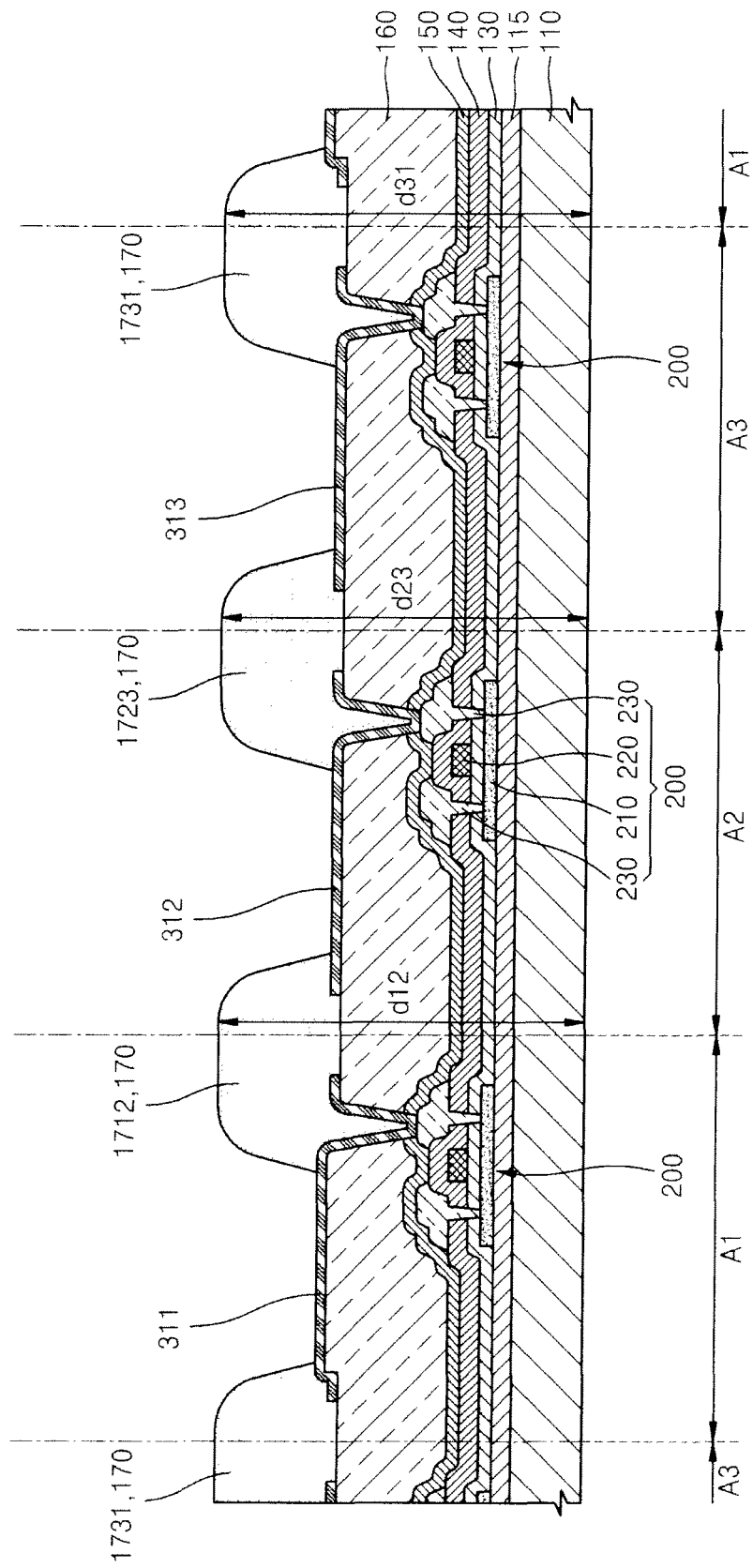

After the first sub-pixel electrode 311, the second sub-pixel electrode 312, and the third sub-pixel electrode 313 are formed, a pixel-defining layer (PDL) 170 is formed as illustrated in FIGS. 2 and 3. The PDL 170 is formed while covering edges of the first sub-pixel electrode 311, the second sub-pixel electrode 312, and the third sub-pixel electrode 313. The PDL 170 is formed on the planarization layer 160 while extending over the first sub-pixel region A1 and the second sub-pixel region A2 and over the second sub-pixel region A2 and the third sub-pixel region A3. Here, the PDL 170 may be formed while extending over the third sub-pixel region A3 and another first sub-pixel region A1.

The PDL 170 may function to define a pixel by having an opening that corresponds to each of the sub-pixels, i.e., the opening to expose a center portion of each of the sub-pixels. Also, the PDL 170 may increase a distance between an end of each of the sub-pixels and an opposite electrode 330 (refer to FIG. 9) thereon and thus may prevent an occurrence of an arc at the ends of the sub-pixels. The PDL 170 may be formed of a single or a composite material layer including a suitable organic material such as polyacrylate, polyimide, or the like, or including a suitable inorganic material.

The PDL 170 may be formed in a manner that a layer for PDL is formed on an entire surface of the substrate 110 by using a material for PDL so as to cover the first sub-pixel electrode 311, the second sub-pixel electrode 312, and the third sub-pixel electrode 313, and then the layer for PDL is patterned to expose and remove center portions of the first sub-pixel electrode 311, the second sub-pixel electrode 312, and the third sub-pixel electrode 313.

Here, as illustrated in FIG. 2, a top surface of a patterned PDL 170' may not be planar. That is, a top surface of a portion 1712' of the patterned PDL 170' which extends over the first sub-pixel region A1 and the second sub-pixel region A2 may not be planar due to a step difference between the top surface of the planarization layer 160 and one of top surfaces of the first and second sub-pixel electrodes 311 and 312, a top surface of a portion 1723' of the patterned PDL 170' which extends over the second sub-pixel region A2 and the third sub-pixel region A3 may not be planar due to a step difference between the top surface of the planarization layer 160 and one of top surfaces of the second and third sub-pixel electrodes 312 and 313, and a top surface of a portion 1731' of the patterned PDL 170' which extends over the third sub-pixel region A3 and another first sub-pixel region A1 may not be planar due to a step difference between the top surface of the planarization layer 160 and one of top surfaces of the third and first sub-pixel electrodes 313 and 311.

Furthermore, depending on a shape of the planarization layer 160, a distance between the substrate 110 and the top surface of the portion 1731' of the patterned PDL 170' which extends over the third sub-pixel region A3 and the other first sub-pixel region A1 may be different from a distance between the substrate 110 and the top surface of the portion 1712' of the patterned PDL 170' which extends over the first sub-pixel region A1 and the second sub-pixel region A2. This difference may cause an irregular contact between a donor film and the PDL 170 when a second EML 322 (refer to FIGS. 5 and 6) or a first EML 321 (refer to FIGS. 7 and 8) is formed later by using a laser induced thermal imaging (LITI) method.

Thus, in this case, by etching at least one portion of the top surface of the patterned PDL 170', the PDL 170 is formed so that a distance between the substrate 110 and the top surface of the PDL 170 is a constant as illustrated in FIG. 3. In FIG. 3, a distance d12 between the top surface of the substrate 110 and a top surface of a portion 1712 of the patterned PDL 170' which extends over the first sub-pixel region A1 and the second sub-pixel region A2, a distance d23 between the top surface of the substrate 110 and a top surface of a portion 1723 of the patterned PDL 170' which extends over the second sub-pixel region A2 and the third sub-pixel region A3, and a distance d31 between the top surface of the substrate 110 and a top surface of a portion 1731 of the patterned PDL 170' which extends over the third sub-pixel region A3 and the other first sub-pixel region A1 are equal to each other. The etching of the at least one portion of the top surface of the patterned PDL 170' may be performed by using one of various suitable methods including a mechanical milling method.

Figure 4:
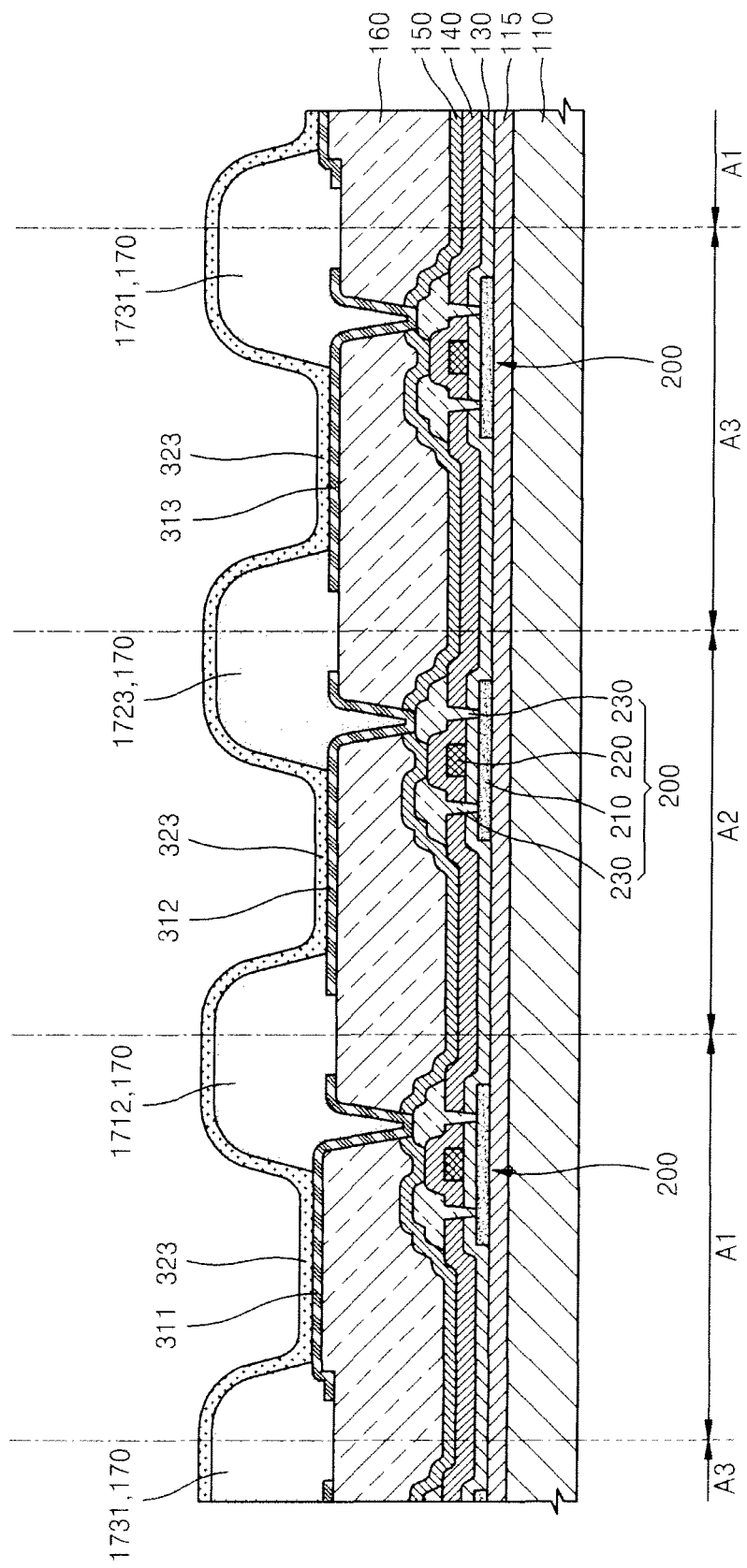

Afterward, as illustrated in FIG. 4, a third EML 323 that covers a portion of the first sub-pixel electrode 311 which is not covered by the PDL 170, a portion of the second sub-pixel electrode 312 which is not covered by the PDL 170, a portion of the third sub-pixel electrode 313 which is not covered by the PDL 170, and the top surface of the PDL 170 is formed. That is, the third EML 323 is formed while covering all of the first sub-pixel region A1, the second sub-pixel region A2, and the third sub-pixel region A3. The third EML 323 may include a material that emits blue light. In one embodiment, when the third EML 323 is formed of a small molecule material, the third EML 323 may be formed via vacuum deposition, and when the third EML 323 is formed of a polymer material, the third EML 323 may be formed by using a screen printing method.

Figure 5:
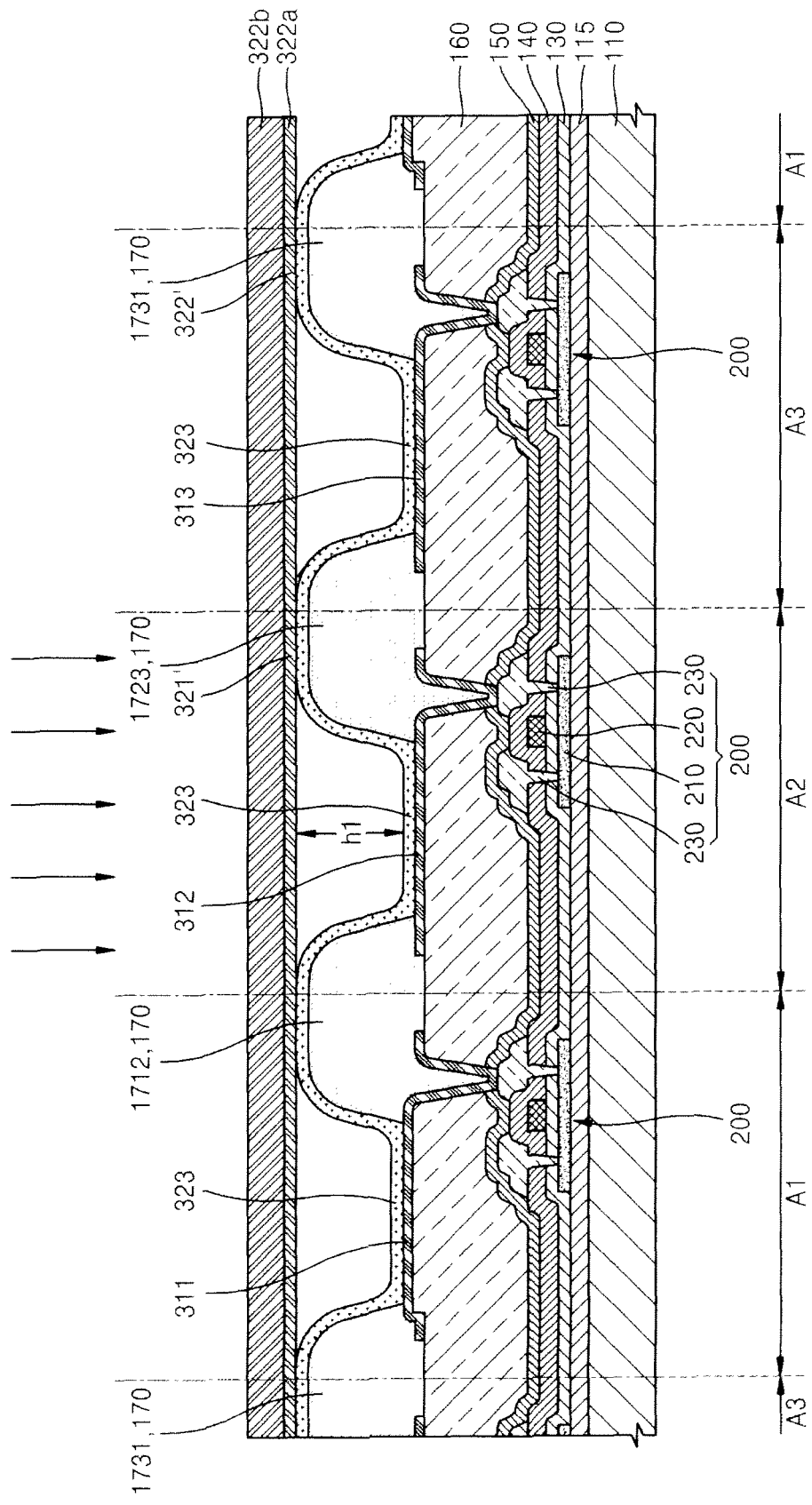
Figure 6:
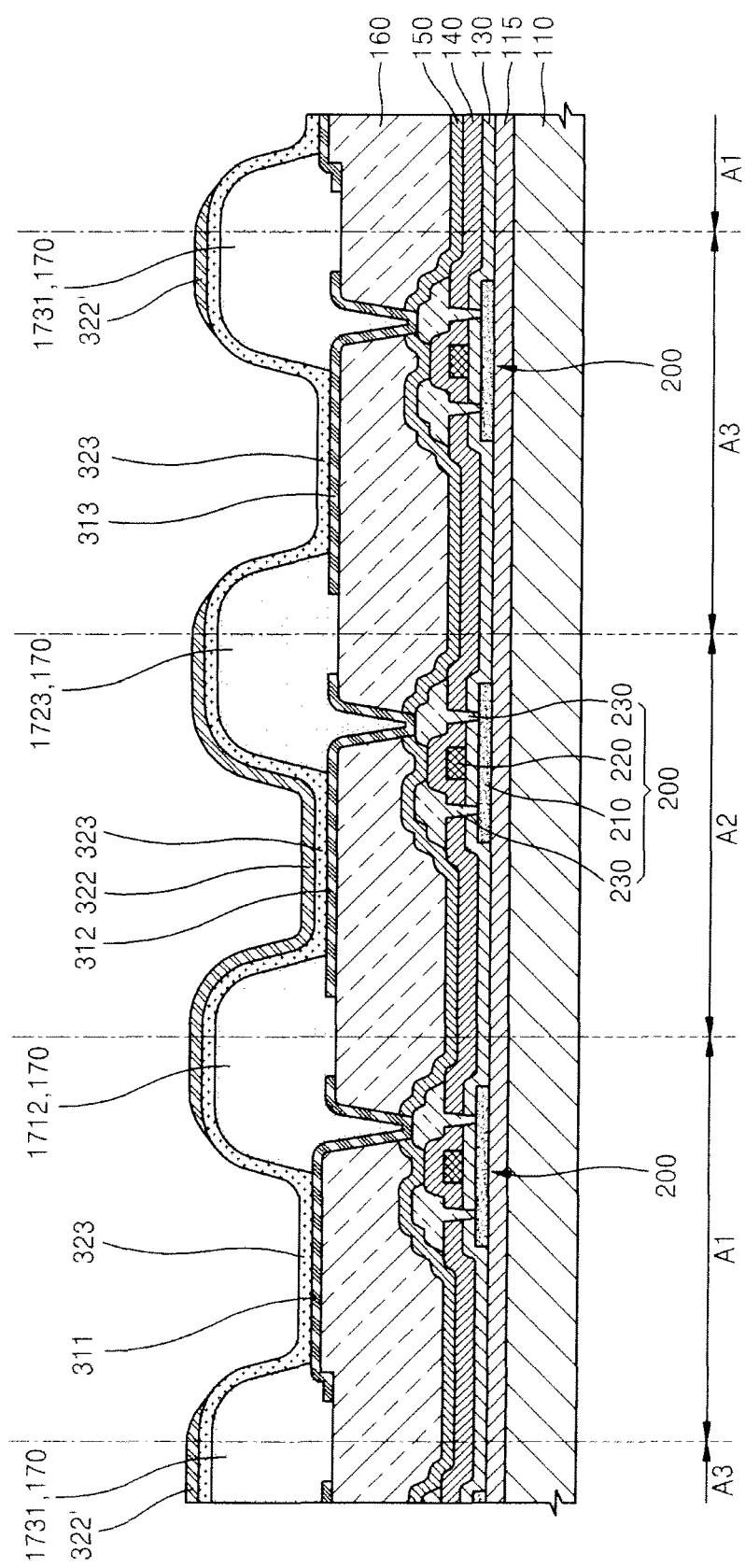

After the third EML 323 is formed, the second EML 322 is formed. The second EML 322 may include a material that emits green light. The second EML 322 may be formed by using the LITI method. That is, as illustrated in FIGS. 5 and 6, a donor film having a structure in which a material layer for the second EML 322*a* is formed on a base film 322*b* may be positioned on the PDL 170 while the material layer for the second EML 322*a* faces the PDL 170, and then a laser beam at a position that corresponds to the second sub-pixel region A2 may be irradiated to the donor film, so that a portion of the material layer for the second EML 322*a* having the laser beam irradiated thereto may be transferred from the base film 322*b* on the second sub-pixel electrode 312. In one embodiment, the donor film further includes various suitable layers such as a light-to-heat conversion layer between the base film 322*b* and the material layer for the second EML 322*a*.

Via the aforementioned processes using the laser beam irradiation, the second EML 322 is formed on at least one portion of the second sub-pixel electrode 312 which is not covered by the PDL 170, and in more detail, the second EML 322 is formed on a portion of the third EML 323 which is arranged above the second sub-pixel electrode 312. In this process, since a top surface of the portion 1712 of the PDL 170 which extends over the first sub-pixel region A1 and the second sub-pixel region A2, and a top surface of a portion 1723 of the PDL 170 which extends over the second sub-pixel region A2 and the third sub-pixel region A3 contact the material layer for the second EML 322*a* of the donor film, the second EML 322 may also be formed on the contact portions regardless of the laser beam irradiation.

In addition, another portion of the PDL 170 which contacts the material layer for the second EML 322*a* of the donor film, i.e., a top surface of a portion 1731 of the PDL 170 which extends over the third sub-pixel region A3 and the other first sub-pixel region A1 may also contact the material layer for the second EML 322*a* of the donor film, so that a dummy second EML 322' may also be formed on the contact portion.

Figure 7:
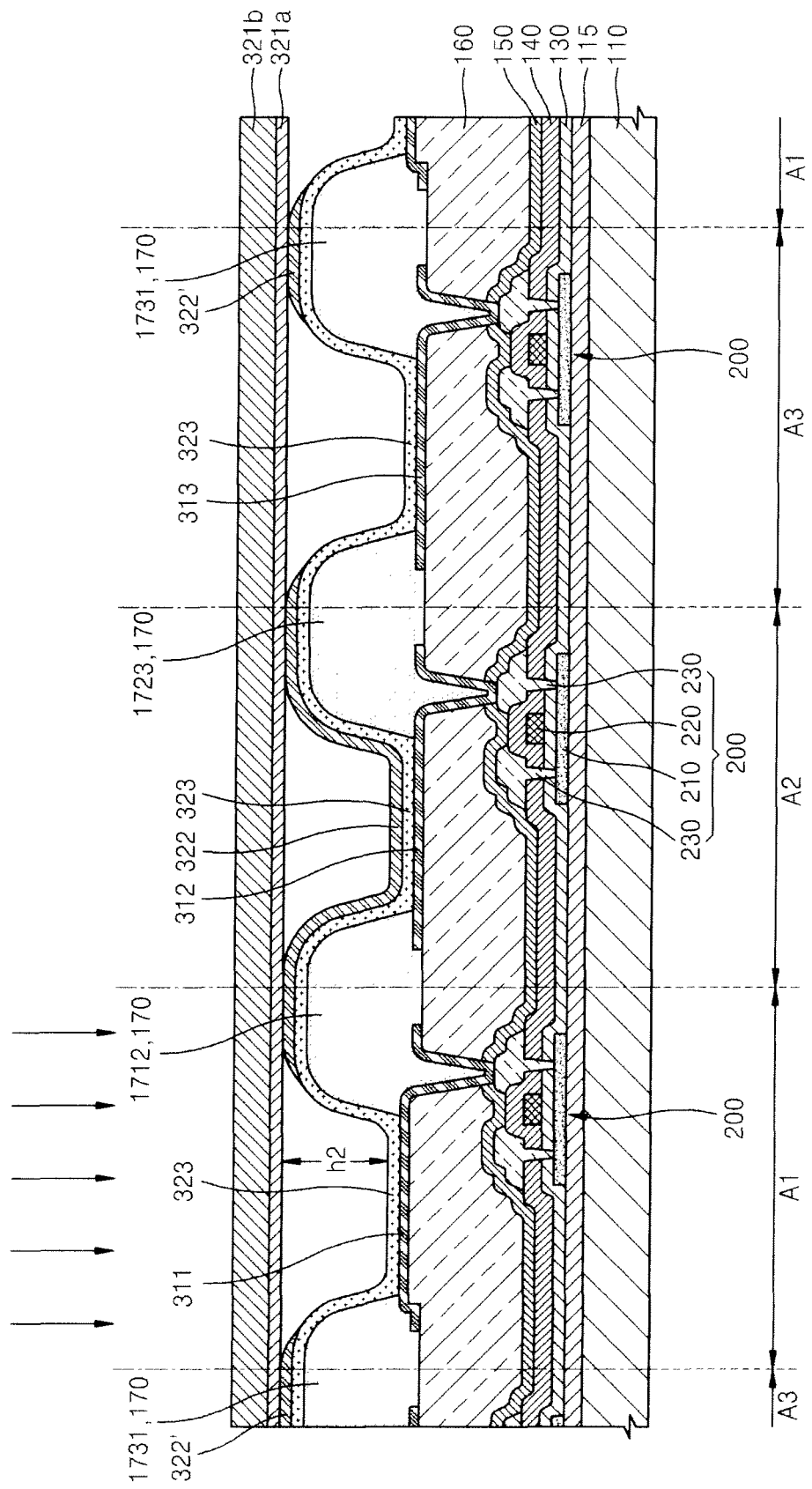
Figure 8:
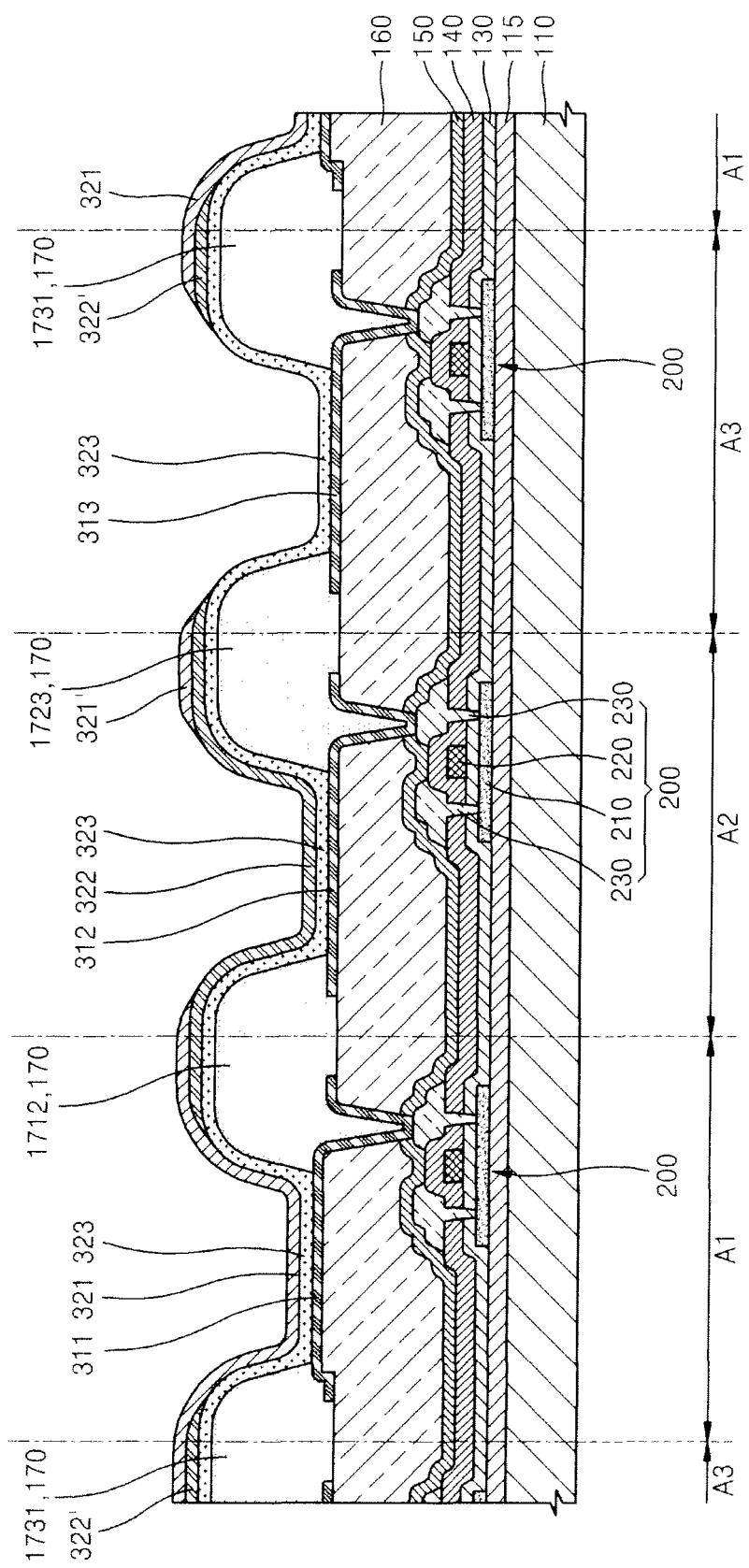

Afterward, as illustrated in FIGS. 7 and 8, the first EML 321 is formed. The first EML 321 may include a material that emits red light. The first EML 321 may also be formed by using the LITI method. That is, as illustrated in FIG. 7, a donor film having a structure in which a material layer for the first EML 321*a* is formed on a base film 321*b* may be positioned on the PDL 170 while the material layer for the first EML 321*a* faces the PDL 170, and then a laser beam at a position that corresponds to the first sub-pixel region A1 may be irradiated to the donor film, so that a portion of the material layer for the first EML 321*a* having the laser beam irradiated thereto may be transferred from the base film 321*b* onto the first sub-pixel electrode 311. Here, when required, the donor film may further include various suitable layers such as a light-to-heat conversion layer between the base film 321*b* and the material layer for the first EML 321*a*.

Via the aforementioned processes using the laser beam irradiation, the first EML 321 is formed on at least one portion of the first sub-pixel electrode 311 which is not covered by the PDL 170, and in more detail, the first EML 321 is formed on a portion of the third EML 323 which is arranged above the first sub-pixel electrode 311. In this process, since a top surface of a portion 1731 of the PDL 170 which extends over the third sub-pixel region A3 and the other first sub-pixel region A1, and a top surface of a portion 1712 of the PDL 170 which extends over the first sub-pixel region A1 and the second sub-pixel region A2 contact the material layer for first EML 321*a* of the donor film, the first EML 321 may also be formed on the contact portions regardless of the laser beam irradiation. Here, since the second EML 322 or the dummy second EML 322' is formed on the contact portions of the PDL 170, the first EML 321 may be formed on the second EML 322 or the dummy second EML 322' on the contact portions.

In addition, another portion of the PDL 170 which contacts the material layer for the first EML 321*a* of the donor film, i.e., a top surface of a portion 1723 of the PDL 170 which extends over the second sub-pixel region A2 and the third sub-pixel region A3 may also contact the material layer for the first EML 321*a* of the donor film, so that a dummy first EML 321' may also be formed on the contact portion. Since the second EML 322 is formed on the corresponding portion of the PDL 170, the dummy first EML 321' may be formed on the second EML 322 that is formed on the corresponding portion.

Figure 9:
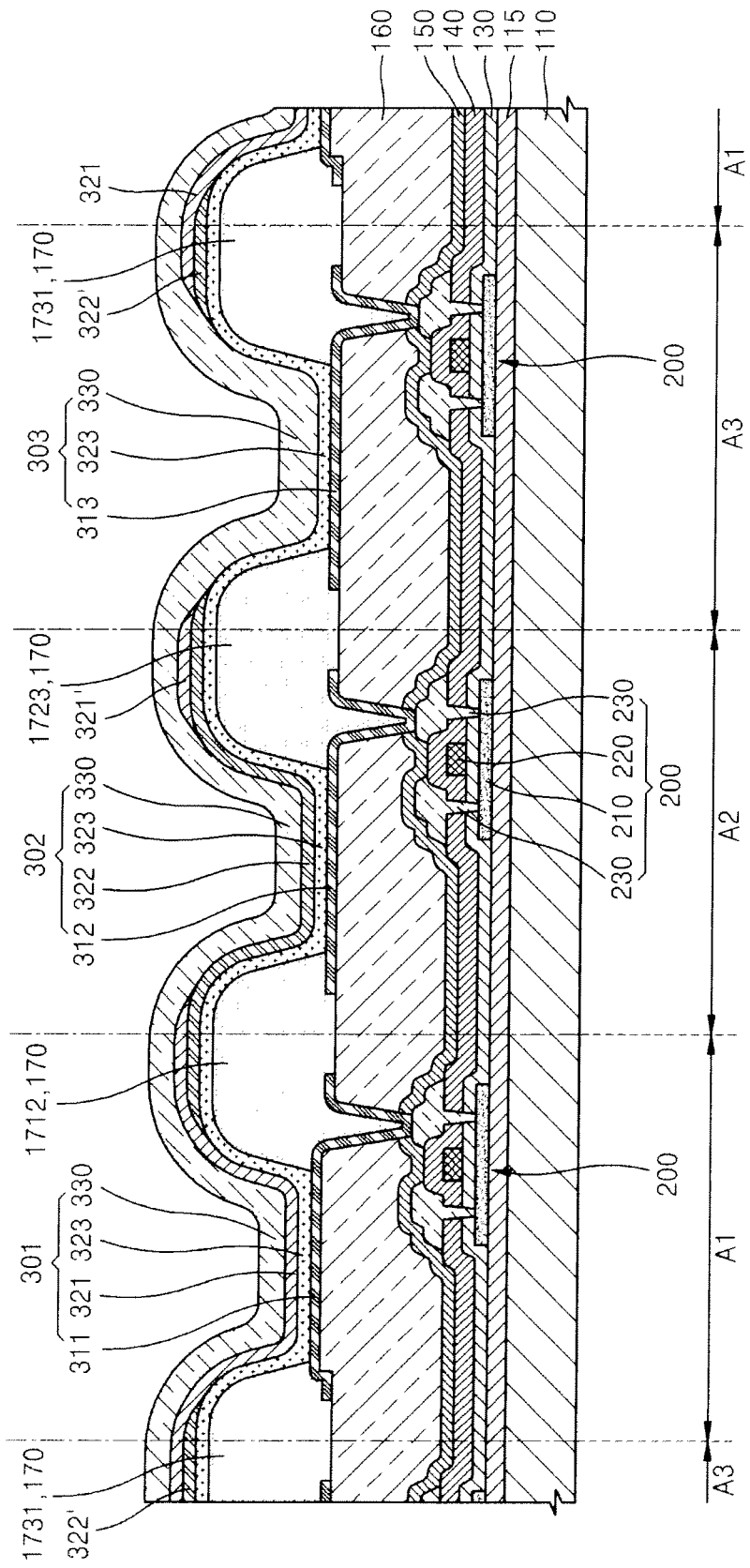
FIG. 9 is a cross-sectional view of an organic light-emitting display apparatus, according to an embodiment of the present invention.

Afterward, when the opposite electrode 330 that covers the first sub-pixel region A1, the second sub-pixel region A2, and the third sub-pixel region A3 is formed, the manufacture of the organic light-emitting display apparatus as shown in FIG. 9 may be completed. The opposite electrode 330 may be integrally formed with respect to the plurality of sub-pixels, thereby covering the whole display area (i.e., an active area). Here, the display area indicates all areas of the organic light-emitting display apparatus which may emit light, e.g., the display area may indicate all areas except for edges of the organic light-emitting display apparatus. Here, if a dead area does not exist on an entire surface of the organic light-emitting display apparatus, the entire surface of the organic light-emitting display apparatus may be the display area.

The opposite electrode 330 contacts an electrode power supply line outside the display area and thus receives an electrical signal from the electrode power supply line. The opposite electrode 330 may be formed as a transparent (transflective) electrode or a reflective electrode. When the opposite electrode 330 is formed as the transparent (transflective) electrode, the opposite electrode 330 may include a layer formed by depositing Li, Ca, LiF/Ca, LiF/Al, Al, Mg or a compound material of any of these in a direction toward the EML 321, 322 or 323, and an auxiliary electrode or a bus electrode line formed of a transparent (transflective) material including ITO, IZO, ZnO or $In_2O_3$. When the opposite electrode 330 is formed as the reflective electrode, the opposite electrode 330 may have a layer including one or more materials selected from among Li, Ca, LiF/Ca, LiF/Al, Al, Ag and Mg. However, configuration and materials of the opposite electrode 330 are not limited thereto and thus may vary.

Compared to a manufacturing method according to the related art, the method of manufacturing the organic light-emitting display apparatus according to embodiments of the present invention provide enhancements such that an intermediate layer of each sub-pixel may be simply formed and a defect rate may be significantly decreased.

As described above, in order to deposit different emission materials on the sub-pixel regions, respectively, a comparable method of manufacturing an organic light-emitting display apparatus uses a mask that has small through holes corresponding to the sub-pixels. However, as the resolution of the organic light-emitting display apparatus is increased, the through holes in the mask become smaller and more densely disposed, which makes the deposition of the emission materials more difficult and the deposition may not be accurately performed.

However, according to the embodiments of method of manufacturing the organic light-emitting display apparatus, since the third EML 323 is formed in all of the first sub-pixel region A1, the second sub-pixel region A2, and the third sub-pixel region A3, an open mask may be used rather than a mask having small through holes, and since a laser beam having a high accuracy is irradiated to form the second EML 322 and the first EML 321, the second EML 322 and the first EML 321 may be formed precisely at their designated positions.

Meanwhile, the distance between the bottom surface of the material layer for the second EML 322a of the donor film and the surface on which the second EML 322 is to be formed (in FIG. 5, the top surface of the third EML 323 on the second sub-pixel electrode 312) is defined as h1. Then, when the first EML 321 is formed after the second EML 322 is formed, the distance between the bottom surface of the material layer for the first EML 321a of the donor film and the surface on which the first EML 321 is to be formed (in FIG. 7, a top surface of the third EML 323 on the first sub-pixel electrode 311) is defined as h2.

As described above, the planarization layer 160 is formed so that the distance d1 (refer to FIG. 1) between the top surface of the substrate 110 and the top surface of the planarization layer 160 at the center of the first sub-pixel region A1 is greater than the distance d2 (refer to FIG. 1) between the top surface of the substrate 110 and the top surface of the planarization layer 160 at the center of one of the second and third sub-pixel regions A2 and A3. Thus, a distance between the substrate 110 and a top surface of the center portion of the first sub-pixel electrode 311 in the first sub-pixel region A1 is greater than a distance between the substrate 110 and a top surface of the center portion of one of the second and third sub-pixel electrodes 312 and 313 in the second sub-pixel region A2 and the third sub-pixel region A3, respectively.

In the aforementioned situation, when the second EML 322 and the first EML 321 is formed by using the LITI method, the distance h1 between the bottom surface of the material layer for the second EML 322a of the donor film and the surface on which the second EML 322 is to be formed (in FIG. 5, the top surface of the third EML 323 on the second sub-pixel electrode 312) may be equal or very similar to the distance h2 between the bottom surface of the material layer for the first EML 321a of the donor film and the surface on which the first EML 321 is formed (in FIG. 7, the top surface of the third EML 323 on the first sub-pixel electrode 311). This means that the intensity of a laser beam that is irradiated to form the second EML 322 and the intensity of a laser beam that is irradiated to form the first EML 321 may be equal or similar to each other.

The fact that the distance h1 and the distance h2 are equal or very similar to each other is because the planarization layer 160 is formed so that the distance d1 between the top surface of the substrate 110 and the top surface of the planarization layer 160 at the center of the first sub-pixel region A1 is greater than the distance d2 between the top surface of the substrate 110 and the top surface of the planarization layer 160 at the center of one of the second and third sub-pixel regions A2 and A3.

When the second EML 322 is formed, only the third EML 323 exists on the PDL 170 so that only the third EML 323 is interposed between the PDL 170 and a donor film to form the second EML 322. However, when the first EML 321 is formed, the second EML 322 or the dummy second EML 322' as well as the third EML 323 exist on the PDL 170 so that the second EML 322 or the dummy second EML 322' as well as the third EML 323 are interposed between the PDL 170 and a donor film to form the first EML 321. Thus, if the planarization layer 160 is formed in such a manner that the distance d1 (refer to FIG. 1) between the top surface of the substrate 110 and the top surface of the planarization layer 160 at the center of the first sub-pixel region A1 is equal to the distance d2 (refer to FIG. 1) between the top surface of the substrate 110 and the top surface of the planarization layer 160 at the center of one of the second and third sub-pixel regions A2 and A3, this means that the distance h2 with respect to formation of the first EML 321 becomes greater than the distance h1 with respect to formation of the second EML 322. Due to this difference, the intensity of the laser beam that is irradiated to form the second EML 322 has to differ from the intensity of the laser beam that is irradiated to form the first EML 321. If the intensity of the laser beam that is irradiated to form the second EML 322 differs from the intensity of the laser beam that is irradiated to form the first EML 321, durability of the second EML 322 differs from durability of the first EML 321, thereby causing a defective organic light-emitting display apparatus or a short-lifted organic light-emitting display apparatus.

However, according to the method of manufacturing the organic light-emitting display apparatus of embodiments of the present invention, even when the second EML 322 is formed, only the third EML 323 exists on the PDL 170 so that only the third EML 323 is interposed between the PDL 170 and the donor film to form the second EML 322, and, even when the first EML 321 is formed, the second EML 322 or the dummy second EML 322' as well as the third EMS 323 exist on the PDL 170 so that the second EML 322 or the dummy second EML 322' as well as the third EML 323 are interposed between the PDL 170 and the donor film to form the first EML 321, the distance h1 with respect to formation of the second EML 322 and the distance h2 with respect to formation of the first EML 321 may be equal or very similar to each other. This is because the distance difference due to the existence of the second EML 322 or the dummy second EML 322' may be offset in a manner that the planarization layer 160 is formed so that the distance d1 between the top surface of the substrate 110 and the top surface of the planarization layer 160 at the center of the first sub-pixel region A1 is greater than the distance d2 between the top surface of the substrate 110 and the top surface of the planarization layer 160 at the center of one of the second and third sub-pixel regions A2 and A3. Accordingly, the intensity of the laser beam that is irradiated to form the second EML 322 and the intensity of the laser beam that is irradiated to form the first EML 321 may be equal to each other.

In the organic light-emitting display apparatus manufactured by using the method according to embodiments of the present embodiment, a step difference between a top surface of the second EML 322 on the portion 1712 of the PDL 170 which extends over the first sub-pixel region A1 and the second sub-pixel region A2 and a top surface of the center of the first sub-pixel electrode 311 is equal to a step difference between a bottom surface of the second EML 322 on the portion 1712 of the PDL 170 which extends over the first sub-pixel region A1 and the second sub-pixel region A2 and a top surface of the center of the second sub-pixel electrode 312.

In the above, the second EML 322 and the first EML 321 are formed after the third EML 323 is formed but one or more embodiments of the present invention are not limited thereto. That is, since the third EML 323 is almost equally formed in the first sub-pixel region A1, the second sub-pixel region A2, and the third sub-pixel region A3, the third EML 323 may be formed after the second EML 322 and the first EML 321 are formed, or, alternatively, the second EML 322 may be formed first, and then the third EML 323 may be formed before the first EML 321 is formed.

In the drawings, for convenience of description, only the EMLs are shown to be interposed between the pixel electrodes and the opposite electrode. However, in addition to the EMLs, when required, a hole injection layer (HIL), an interlayer or a primer layer, an electron transport layer (ETL) and/or an electron injection layer (EIL), or the like may be interposed between the pixel electrode and the opposite electrode. Here, some of the aforementioned layers may be simultaneously formed in one act (step) with the EMLs by using the LITI method or may be formed via a separate process such as deposition.

For example, a first sub-pixel 301 of the first sub-pixel region A1 may emit blue and red-mixed light, a second sub-pixel 302 of the second sub-pixel region A2 may emit blue and green-mixed light, and a third sub-pixel 303 of the third sub-pixel region A3 may emit blue light. By adjusting the amount of emission from each of the aforementioned sub-pixels, it is possible to realize a full-color organic light-emitting display apparatus.

Figure 10:
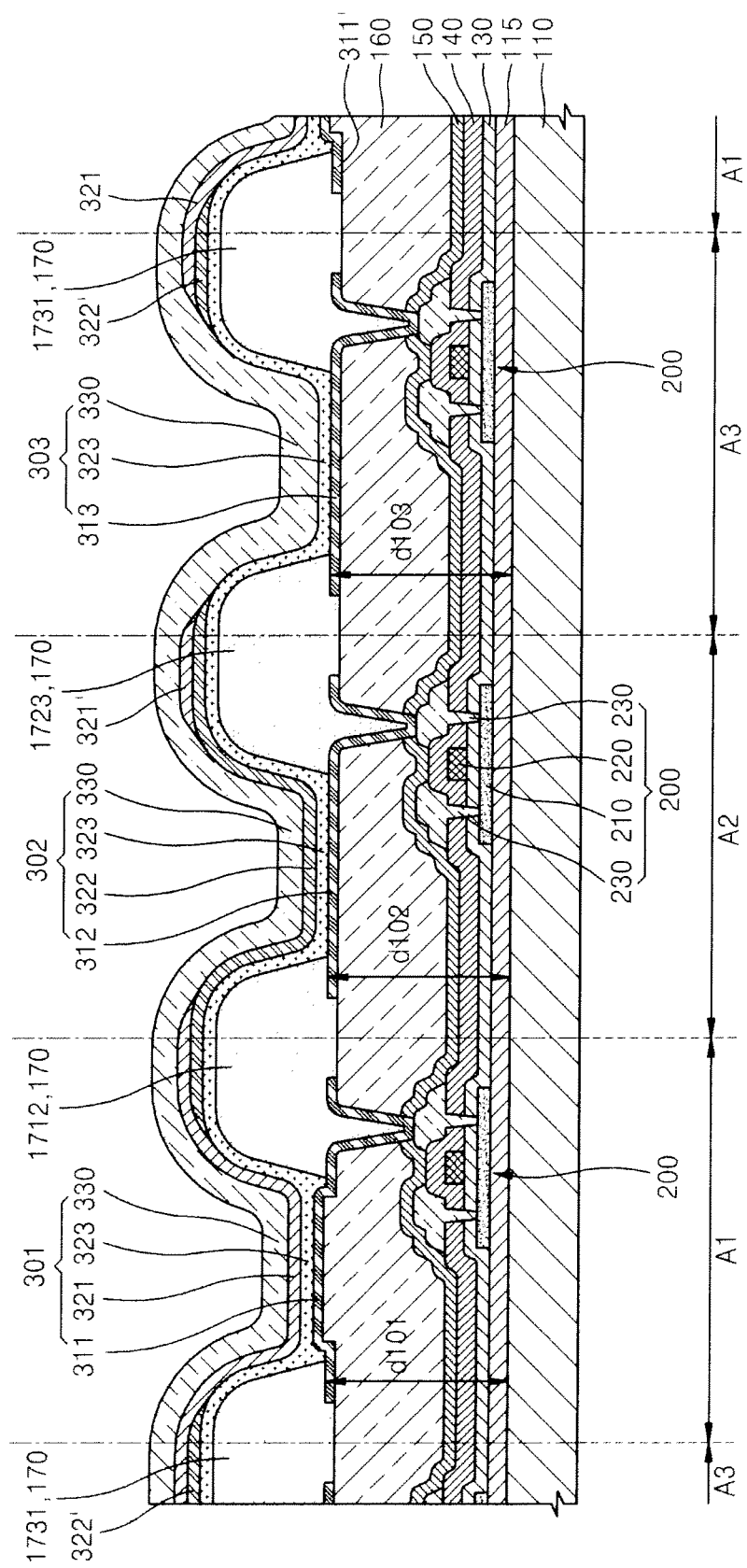
FIG. 10 is a cross-sectional view of an organic light-emitting display apparatus, according to another embodiment of the present invention.

FIG. 10 is a cross-sectional view of an organic light-emitting display apparatus that is manufactured by using a method of manufacturing an organic light-emitting display apparatus, according to another embodiment of the present invention. According to the method of manufacturing the organic light-emitting display apparatus of the present embodiment, a planarization layer 160 is formed so that a distance between a substrate 110 and a top surface of the planarization layer 160 at a center of a first sub-pixel region A1 is greater than a distance between the substrate 110 and the top surface of the planarization layer 160 at an edge of the first sub-pixel region A1. That is, the planarization layer 160 is formed so that the top surface of the planarization layer 160 is protruded in a center portion of the first sub-pixel region A1.

A first sub-pixel electrode 311 is formed to cover at least a portion of the top surface of the planarization layer 160 at the edge of the first sub-pixel region A1 and the top surface of the planarization layer 160 at the center of the first sub-pixel region A1. Then, a PDL 170 is formed in such a manner that a top surface of the portion 1712 of the PDL 170 which extends over the first sub-pixel region A1 and a second sub-pixel region A2 covers a portion of the first sub-pixel electrode 311 which is positioned in the edge of the first sub-pixel region A1. Here, as shown in FIG. 10, a portion 1731 of the PDL 170 which extends over a third sub-pixel region A3 and the first sub-pixel region A1 may be formed to cover the portion of the first sub-pixel electrode 311 which is positioned at the edge 311' of the first sub-pixel region A1.

According to the method of manufacturing the organic light-emitting display apparatus of the previous embodiment, the top surface of the patterned PDL 170' as illustrated in FIG. 2 may not be planar. In particular, when the portion 1731' of the patterned PDL 170' as illustrated in FIG. 2 which extends over the third sub-pixel region A3 and another first sub-pixel region A1 covers the protruded portion of the planarization layer 160 of the first sub-pixel electrode 311, a distance between the substrate 110 and a top surface of the PDL 170' covering the portion of the first sub-pixel electrode 311 is different from a distance between the substrate 110 and the top surface of the PDL 170' covering the portion of a third sub-pixel electrode 313, compared to a case in which a portion 1723' of the patterned PDL 170' which extends over the second sub-pixel region A2 and the third sub-pixel region A3 covers the third sub-pixel electrode 313. This difference in the distances may cause a height difference between a top surface of the portion 1731' of the patterned PDL 170' and a top surface of the portion 1723' of the patterned PDL 170', and the height difference may cause irregular etching to be performed when the top surface of the patterned PDL 170' is etched.

However, referring to FIG. 10, according to the method of manufacturing the organic light-emitting display apparatus of the present embodiment, a distance d101 between the substrate 110 and a contact portion of the portion 1731 of the PDL 170 and the first sub-pixel electrode 311, a distance d102 between the substrate 110 and a contact portion of the portion 1712 of the PDL 170 and the second sub-pixel electrode 312, and a distance d103 between the substrate 110 and a contact portion of the portion 1723 of the PDL 170 and the third sub-pixel electrode 313 are equal to each other. Thus, the PDL 170 may be formed under the same conditions, so that the PDL 170 may be formed exactly according to a desired set or predetermined height, and also, when a mechanical milling operation is required to form the PDL 170, a milling process may be accurately performed.

In addition, although a top surface of the PDL 170 is not planar when the PDL 170 is formed, shapes or distances between the substrate 110 and the uneven top surfaces of the portions 1712, 1723, and 1731 of the PDL 170 are equal to each other, even though the top surface of the PDL 170 is not etched. Thus, there may be no problem when a second EML 322 or a first EML 321 is formed later by using a LITI method.

Figure 11:
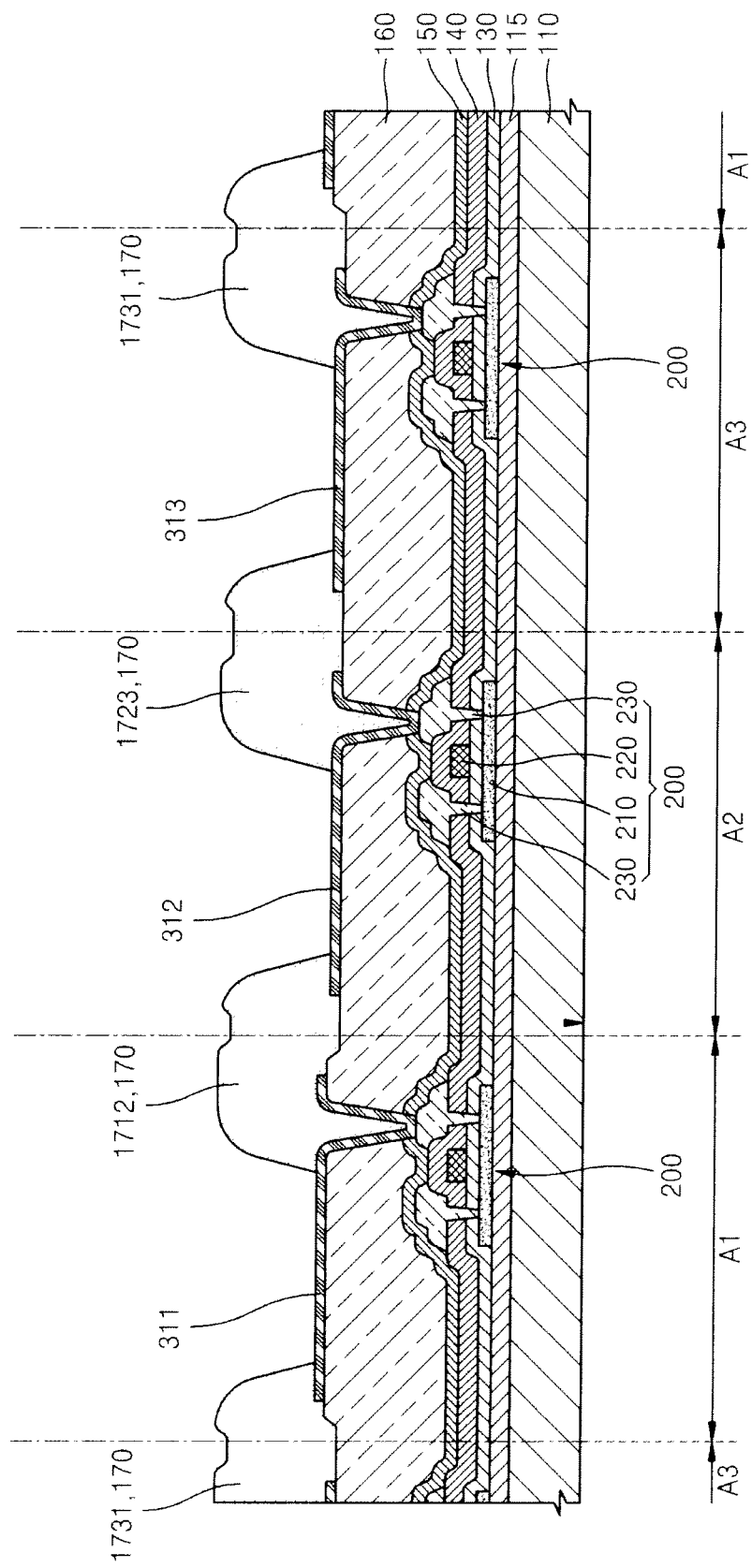
FIG. 11 is a cross-sectional view illustrating a process of manufacturing an organic light-emitting display apparatus, according to another embodiment of the present invention.
Figure 12:
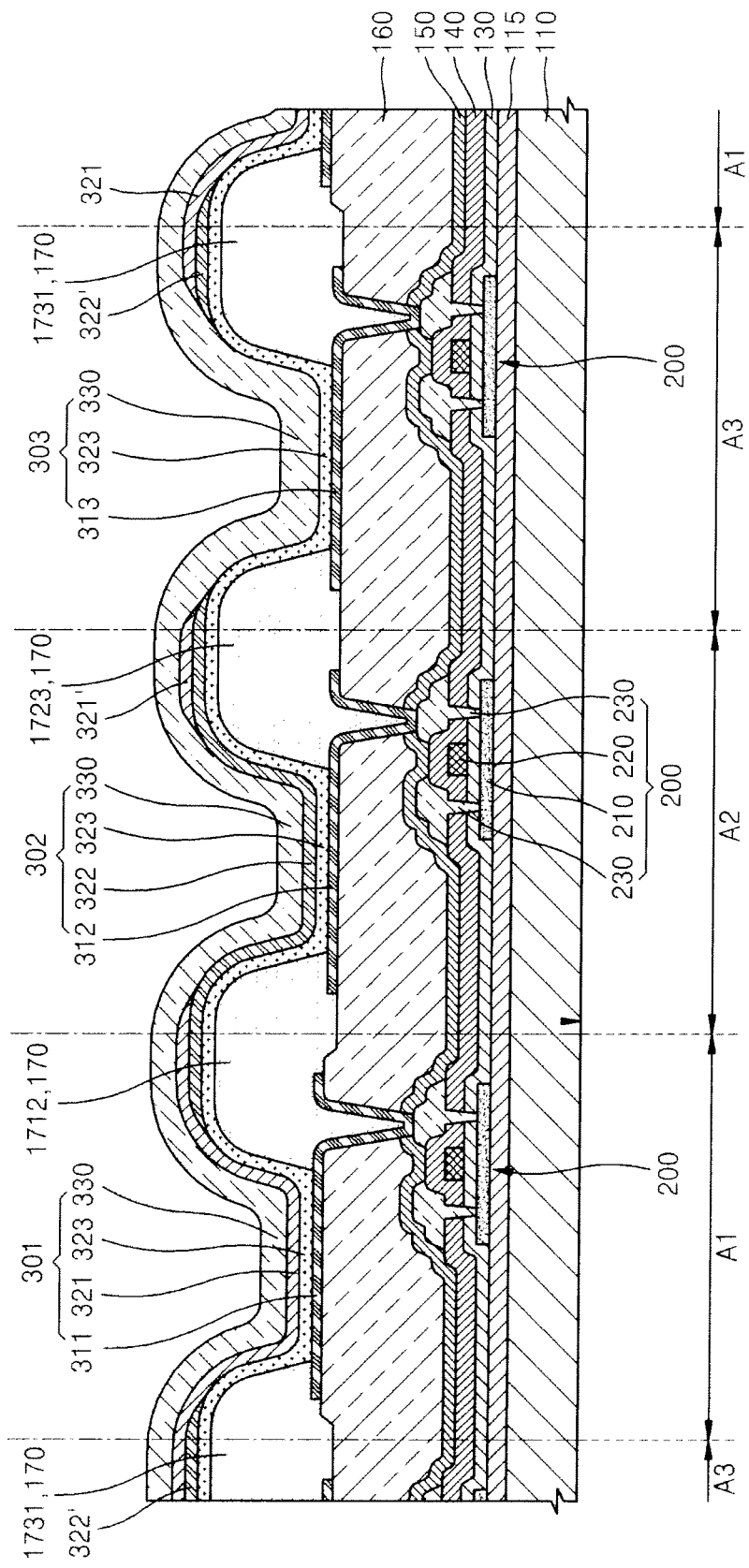
FIG. 12 is a cross-sectional view of an organic light-emitting display apparatus, according to another embodiment of the present invention.

FIG. 11 is a cross-sectional view illustrating a process of a method of manufacturing an organic light-emitting display apparatus, according to another embodiment of the present invention. FIG. 12 is a cross-sectional view of an organic light-emitting display apparatus that is manufactured by using the method of FIG. 11.

According to the method of manufacturing the organic light-emitting display apparatus of the present embodiment, a planarization layer 160 is formed so that a distance between a substrate 110 and a top surface of the planarization layer 160 at a center of a first sub-pixel region A1 is greater than a distance between the substrate 110 and the top surface of the planarization layer 160 at an edge of the first sub-pixel region A1. That is, the planarization layer 160 is formed so that the top surface of the planarization layer 160 is protruded at a center portion of the first sub-pixel region A1.

Then, a first sub-pixel electrode 311 is formed on the top surface of the planarization layer 160 in the center of the first sub-pixel region A1. That is, the first sub-pixel electrode 311 is formed on the protruded portion in the top surface of the planarization layer 160.

According to the method of manufacturing the organic light-emitting display apparatus of the present embodiment, the first sub-pixel electrode 311, a second sub-pixel electrode 312, and a third sub-pixel electrode 313 are all formed on planar surfaces. Thus, a defect rate in forming sub-pixel electrodes may be decreased, hole injection or electron injection into an EML of each of the sub-pixel electrodes may be smoothly performed, and the hole injection or the electron injection may be uniformly or similarly formed in the sub-pixel electrodes.

Embodiments of the method of manufacturing the organic light-emitting display apparatus have been described above; however, the present invention is not limited thereto. For example, the organic light-emitting display apparatus is also included in the scope of the present invention.

For example, the organic light-emitting display apparatus in FIG. 9 according to an embodiment of the present invention includes the substrate 110, the planarization layer 160, the first sub-pixel electrode 311, the second sub-pixel electrode 312, and the third sub-pixel electrode 313. Here, as illustrated, the organic light-emitting display apparatus may further include the PDL 170, the first EML 321, the second EML 322, the third EML 323, and the opposite electrode 330.

The substrate 110 has the first sub-pixel region A1, the second sub-pixel region A2, and the third sub-pixel region A3. The planarization layer 160 covers the first sub-pixel region A1, the second sub-pixel region A2, and the third sub-pixel region A3 in such a manner that a distance between a top surface of the substrate 110 and a top surface of the planarization layer 160 at a center of the first sub-pixel region A1 is greater than a distance between a top surface of the substrate 110 and the top surface of the planarization layer 160 at a center of one of the second and third sub-pixel regions A2 and A3. Sub-pixel electrodes are disposed on the planarization layer 160, e.g., the first sub-pixel electrode 311 is disposed in the first sub-pixel region A1, the second sub-pixel electrode 312 is disposed in the second sub-pixel region A2, and the third sub-pixel electrode 313 is disposed in the third sub-pixel region A3.

In the organic light-emitting display apparatus according to the present embodiment, as described above, the distance d1 between the top surface of the substrate 110 and the top surface of the planarization layer 160 at the center of the first sub-pixel region A1 is greater than the distance d2 between the top surface of the substrate 110 and the top surface of the planarization layer 160 at the center of one of the second and third sub-pixel regions A2 and A3. Thus, a distance between the substrate 110 and a top surface of a center region of the first sub-pixel electrode 311 formed in the first sub-pixel region A1 is greater than a distance between the substrate 110 and a top surface of a center region of the second sub-pixel electrode 312 formed in the second sub-pixel region A2 or is greater than a distance between the substrate 110 and a top surface of a center region of the third sub-pixel electrode 313 formed in the third sub-pixel region A3. The aforementioned feature may be a basis for reducing an occurrence of a defect in the first sub-pixel region A1 and the second sub-pixel region A2, when an EML or an intermediate layer including the EML is formed as will be described later.

The third EML 323 may be disposed while covering a portion of the first sub-pixel electrode 311 which is not covered by the PDL 170, a portion of the second sub-pixel electrode 312 which is not covered by the PDL 170, a portion of the third sub-pixel electrode 313 which is not covered by the PDL 170, and the top surface of the PDL 170. That is, the third EML 323 may be disposed while covering all of the first sub-pixel region A1, the second sub-pixel region A2, and the third sub-pixel region A3. The third EML 323 may include a material that emits blue light.

The second EML 322 may include a material that emits green light. As described above, the second EML 322 may be formed by using the LITI method. The second EML 322 is formed on at least one portion of the second sub-pixel electrode 312 which is not covered by the PDL 170, and in more detail, the second EML 322 is formed on a portion of the third EML 323 which is arranged above the second sub-pixel electrode 312.

When the second EML 322 is formed by using the LITI method as described above, the second EML 322 may be formed on a top surface of a portion 1712 of the PDL 170 which extends over the first sub-pixel region A1 and the second sub-pixel region A2, and a top surface of a portion 1723 of the PDL 170 which extends over the second sub-pixel region A2 and the third sub-pixel region A3. Here, while the second EML 322 is formed by using the LITI method, a dummy second EML 322' may be formed on another portion of the PDL 170, e.g., a top surface of a portion 1731 of the PDL 170 which extends over the third sub-pixel region A3 and the other first sub-pixel region A1.

The first EML 321 may include a material that emits red light. The first EML 321 may also be formed by using the LITI method as described above. The first EML 321 may be positioned on at least one portion of the first sub-pixel electrode 311 which is not covered by the PDL 170, in more detail, the first EML 321 may be positioned on a portion of the third EML 323 on the first sub-pixel electrode 311.

As described above, the first EML 321 may be formed on a top surface of a portion 1731 of the PDL 170 which extends over the third sub-pixel region A3 and the first sub-pixel region A1 and may be formed on a top surface of the portion 1712 of the PDL 170 which extends over the first sub-pixel region A1 and the second sub-pixel region A2. Here, since the second EML 322 and/or the dummy second EML 322' is formed on the corresponding portions on the PDL 170, the first EML 321 may be formed on the second EML 322 and/or the dummy second EML 322' on the corresponding portions.

In addition, a dummy first EML 321' may be formed on a top surface of a portion 1723 of the PDL 170 which extends over the second sub-pixel region A2 and the third sub-pixel region A3. Here, since the second EML 322 is formed on the corresponding portion on the PDL 170, the dummy first EML 321' may be formed on the second EML 322 on the corresponding portion.

The opposite electrode 330 that is disposed on the aforementioned EMLs is as described above.

According to the method of manufacturing the organic light-emitting display apparatus of the present embodiment, an intermediate layer of each sub-pixel may be simply formed and a defect rate may be significantly decreased.

That is, in the organic light-emitting display apparatus according to the present embodiment, since the third EML 323 is formed in all of the first sub-pixel region A1, the second sub-pixel region A2, and the third sub-pixel region A3, an open mask may be used rather than a mask having small through holes, and since a laser beam having a high accuracy is irradiated to form the second EML 322 and the first EML 321, the second EML 322 and the first EML 321 may be formed at exact positions so that a yield rate of production may be significantly increased.

Furthermore, since the planarization layer 160 has the aforementioned shape, when the second EML 322 is formed, a distance h1 (refer to FIG. 5) between a bottom surface of a donor film 322a and a top surface of 323 on which the second EML 322 is to be formed, and when the first EML 321 is formed, a distance h2 (refer to FIG. 7) between the bottom surface of the donor film 321a and a top surface of 323 on which the first EML 321 is to be formed, may be equal or very similar to each other. This is because the distance difference due to the existence of the second EML 322 or the dummy second EML 322' may be offset in such a manner that the planarization layer 160 is formed so that the distance d1 between the top surface of the substrate 110 and the top surface of the planarization layer 160 at the center of the first sub-pixel region A1 is greater than the distance d2 between the top surface of the substrate 110 and the top surface of the planarization layer 160 at the center of one of the second and third sub-pixel regions A2 and A3. Accordingly, the intensity of the laser beam that is irradiated to form the second EML 322 and the intensity of the laser beam that is irradiated to form the first EML 321 may be equal to each other.

In the organic light-emitting display apparatus manufactured according to the present embodiment, a step difference between a top surface of the second EML 322 on the portion 1712 of the PDL 170 which extends over the first sub-pixel region A1 and the second sub-pixel region A2 and a top surface of the center of the first sub-pixel electrode 311 is equal to a step difference between a bottom surface of the second EML 322 on the portion 1712 of the PDL 170 which extends over the first sub-pixel region A1 and the second sub-pixel region A2 and a top surface of the center of the second sub-pixel electrode 312.

In the above, it is described that the first EML 321 is formed on the third EML 323 in a first sub-pixel 301, and the second EML 322 is formed on the third EML 323 in a second sub-pixel 302, but the one or more embodiments of the present invention are not limited thereto. That is, the third EML 323 covers the first sub-pixel region A1, the second sub-pixel region A2, and the third sub-pixel region A3 of the substrate 110, and in this regard, the third EML 323 is disposed on the first EML 321 in the first sub-pixel 301, and the third EML 323 is disposed on the second EML 322 in the second sub-pixel 302. Also, the third EML 323 is almost equally formed in the first sub-pixel region A1, the second sub-pixel region A2, and the third sub-pixel region A3. Thus, alternatively, the second EML 322 may be disposed on the portion 1712 of the PDL 170 which extends over the first sub-pixel region A1 and the second sub-pixel region A2, the third EML 323 may be formed thereon, and the first EML 321 may be formed thereabove.

In FIG. 9, for convenience of description, only the EMLs are shown to be interposed between the pixel electrodes and the opposite electrode 330. However, in addition to the EMLs, when required, an HIL, an interlayer (or a primer layer), an ETL, or an EIL, and/or the like may be interposed between the pixel electrodes and the opposite electrode 330.

FIG. 10 is a cross-sectional view of an organic light-emitting display apparatus, according to another embodiment of the present invention. In the organic light-emitting display apparatus according to the present embodiment, the distance between the substrate 110 and the top surface of the planarization layer 160 at a center portion of the first sub-pixel region A1 is greater than the distance between the substrate 110 and the top surface of the planarization layer 160 at an edge of the first sub-pixel region A1. That is, the top surface of the planarization layer 160 is protruded in the center portion of the first sub-pixel region A1.

In addition, the first sub-pixel electrode 311 covers at least one portion of the top surface of the planarization layer 160 in the edge of the first sub-pixel region A1 and the top surface of the planarization layer 160 in the center portion of the first sub-pixel region A1. The PDL 170 covers a part of the portion 1712 of the PDL 170 which extends over the first sub-pixel region A1 and the second sub-pixel region A2, wherein the part is disposed at the first sub-pixel electrode 311 at the edge of the first sub-pixel region A1. Here, as illustrated, a portion 1731 of the PDL 170 which extends over the third sub-pixel region A3 and the other first sub-pixel region A1 may cover the first sub-pixel electrode 311 at the edge of the first sub-pixel region A1.

In the organic light-emitting display apparatus manufactured according to the present embodiment, a distance between the substrate 110 and a contact portion of the portion 1731 of the PDL 170 with the first sub-pixel electrode 311, a distance between the substrate 110 and a contact portion of the portion 1712 of the PDL 170 with the second sub-pixel electrode 312, and a distance between the substrate 110 and a contact portion of the portion 1723 of the PDL 170 with the third sub-pixel electrode 313 are equal to each other. Thus, the PDL 170 may be formed under the same condition, so that the PDL 170 may be exactly formed according to a desired set or predetermined height, and also, when a mechanical milling operation is required to form the PDL 170, a milling process may be performed precisely.

In addition, although a top surface of the PDL 170 is not planar when the PDL 170 is formed, shapes or distances between the substrate 110 and the uneven top surface portions of 1712, 1723, and 1731 of the PDL 170 are equal to each other, even though the top surface of the PDL 170 is not etched. Thus, there may be no problem when a second EML 322 or a first EML 321 is formed later by using a LITI method.

FIG. 12 is a cross-sectional view of an organic light-emitting display apparatus, according to another embodiment of the present invention.

In the organic light-emitting display apparatus according to the present embodiment, a distance between the substrate 110 and a top surface of the planarization layer 160 in a center portion of the first sub-pixel region A1 is greater than a distance between the substrate 110 and the top surface of the planarization layer 160 in an edge of the first sub-pixel region A1. That is, the top surface of the planarization layer 160 is protruded in the center portion of the first sub-pixel region A1. The first sub-pixel electrode 311 is disposed on the top surface of the planarization layer 160 in the center portion of the first sub-pixel region A1. That is, the first sub-pixel electrode 311 is disposed on the protruded portion in the top surface of the planarization layer 160.

In the organic light-emitting display apparatus according to the present embodiment, the first sub-pixel electrode 311, a second sub-pixel electrode 312, and a third sub-pixel electrode 313 are all formed on planar surfaces. Thus, a defect rate in forming sub-pixel electrodes may be decreased, hole injection or electron injection into an EML of each of the sub-pixel electrodes may be smoothly performed, and the hole injection or the electron injection may be uniformly or similarly formed in the sub-pixel electrodes.

Here, at a portion 1712 of the PDL 170 which extends over the first sub-pixel region A1 and the second sub-pixel region A2, a distance between a top surface of the PDL 170 and a top surface of a portion of the second sub-pixel electrode 312 which is covered by the PDL 170 may be greater than a distance between the top surface of the PDL 170 and a top surface of a portion of the first sub-pixel electrode 311 which is covered by the PDL 170. By doing so, when the first EML 321 is formed after the second EML 322 is formed, the first EML 321 may be formed according to forming conditions that are equal or very similar to forming conditions with respect to the second EML 322.

According to the one or more embodiments of the present invention, it is possible to realize the organic light-emitting display apparatus of which a defect rate is significantly decreased in a manufacturing procedure and a method of manufacturing the organic light-emitting display apparatus.

While the present invention has been particularly shown and described with reference to example embodiments thereof, it will be understood by those of ordinary skill in the art that various changes in form and details may be made therein without departing from the spirit and scope of the present invention as defined by the following claims and equivalents thereof.

What is claimed is:

1. An organic light-emitting display apparatus comprising:
   a substrate having a first sub-pixel region, a second sub-pixel region, and a third sub-pixel region;
   a planarization layer covering the first sub-pixel region, the second sub-pixel region, and the third sub-pixel region, such that a distance between the substrate and a top surface of the planarization layer at a center of the first sub-pixel region is greater than a distance between the substrate and the top surface of the planarization layer at a center of the second sub-pixel region or greater than a distance between the substrate and the top surface of the planarization layer at a center of the third sub-pixel region; and
   a first sub-pixel electrode on the planarization layer in the first sub-pixel region, a second sub-pixel electrode on the planarization layer in the second sub-pixel region, and a third sub-pixel electrode on the planarization layer in the third sub-pixel region, wherein
   each of the first, second and third sub-pixel regions has a same stacking of layers between the substrate and the top surface of the planarization layer at the center of the respective first, second or third sub-pixel region.

2. The organic light-emitting display apparatus of claim 1, further comprising a pixel-defining layer (PDL) on the planarization layer and extending over the first sub-pixel region and the second sub-pixel region and over the second sub-pixel region and the third sub-pixel region to cover edges of the first sub-pixel electrode, the second sub-pixel electrode, and the third sub-pixel electrode.

3. The organic light-emitting display apparatus of claim 2, wherein a distance between the substrate and a top surface of a portion of the PDL that extends over the first sub-pixel region and the second sub-pixel region so as to cover the edge of the first sub-pixel electrode and the edge of the second sub-pixel electrode is equal to a distance between the substrate and a top surface of a portion of the PDL that extends over the second sub-pixel region and the third sub-pixel region so as to cover the edge of the second sub-pixel electrode and the edge of the third sub-pixel electrode.

4. The organic light-emitting display apparatus of claim 3, wherein the planarization layer is formed such that a distance between the substrate and the top surface of the planarization layer at the center of the first sub-pixel region is greater than a distance between the substrate and a top surface of the planarization layer at an edge of the first sub-pixel region.

5. The organic light-emitting display apparatus of claim 4, wherein the first sub-pixel electrode is on the top surface of the planarization layer at the center of the first sub-pixel region.

6. The organic light-emitting display apparatus of claim 5, wherein, at the portion of the PDL that extends over the first sub-pixel region and the second sub-pixel region, a distance between the top surface of the PDL and a top surface of a portion of the second sub-pixel electrode covered by the PDL is greater than a distance between the top surface of the PDL and a top surface of a portion of the first sub-pixel electrode covered by the PDL.

7. An organic light-emitting display apparatus comprising:
   a substrate having a first sub-pixel region, a second sub-pixel region, and a third sub-pixel region;
   a planarization layer covering the first sub-pixel region, the second sub-pixel region, and the third sub-pixel region, such that a distance between the substrate and a top surface of the planarization layer at a center of the first sub-pixel region is greater than a distance between the substrate and the top surface of the planarization layer at a center of the second sub-pixel region or greater than a distance between the substrate and the top surface of the planarization layer at a center of the third sub-pixel region;
   a first sub-pixel electrode on the planarization layer in the first sub-pixel region, a second sub-pixel electrode on the planarization layer in the second sub-pixel region, and a third sub-pixel electrode on the planarization layer in the third sub-pixel region; and
   a pixel-defining layer (PDL) on the planarization layer and extending over the first sub-pixel region and the second sub-pixel region and over the second sub-pixel region and the third sub-pixel region to cover edges of the first sub-pixel electrode, the second sub-pixel electrode, and the third sub-pixel electrode,
   wherein a distance between the substrate and a top surface of a portion of the PDL that extends over the first sub-pixel region and the second sub-pixel region so as to cover the edge of the first sub-pixel electrode and the edge of the second sub-pixel electrode is equal to a distance between the substrate and a top surface of a portion of the PDL that extends over the second sub-pixel region and the third sub-pixel region so as to cover the edge of the second sub-pixel electrode and the edge of the third sub-pixel electrode;
   wherein the planarization layer is formed such that a distance between the substrate and the top surface of the planarization layer at the center of the first sub-pixel region is greater than a distance between the substrate and a top surface of the planarization layer at an edge of the first sub-pixel region; and
   wherein the first sub-pixel electrode covers at least one portion of the top surface of the planarization layer at the edge of the first sub-pixel region and covers the top surface of the planarization layer at the center of the first sub-pixel region.

8. The organic light-emitting display apparatus of claim 7, wherein the portion of the PDL that extends over the first sub-pixel region and the second sub-pixel region covers a portion of the first sub-pixel electrode at the edge of the first sub-pixel region.

9. The organic light-emitting display apparatus of claim 7, further comprising:
   a second emission layer (second EML) on the top surface of the portion of the PDL that extends over the first sub-pixel region and the second sub-pixel region, on at least a portion of the second sub-pixel electrode that is not covered by the PDL, and on the top surface of the portion of the PDL that extends over the second sub-pixel region and the third sub-pixel region; and
   a first EML on a top surface of the second EML on the top surface of the portion of the PDL that extends over the first sub-pixel region and the second sub-pixel region, on at least a portion of the first sub-pixel electrode that is not covered by the PDL, and on a top surface of the second EML on the top surface of the portion of the PDL that extends over the second sub-pixel region and the third sub-pixel region.

10. The organic light-emitting display apparatus of claim 9, wherein a step difference between a top surface of the second EML on the portion of the PDL that extends over the first sub-pixel region and the second sub-pixel region and a top surface of the center of the first sub-pixel electrode is equal to a step difference between a bottom surface of the second EML on the portion of the PDL that extends over the first sub-pixel region and the second sub-pixel region and a top surface of the center of the second sub-pixel electrode.

11. The organic light-emitting display apparatus of claim 9, further comprising a third EML between the second EML and the PDL, between the second EML and the second sub-pixel electrode, between the first EML and the PDL, and between the first EML and the first sub-pixel electrode, and covering at least a portion of the third sub-pixel electrode that is not covered by the PDL.

12. A method of manufacturing an organic light-emitting display apparatus, the method comprising:
    preparing a substrate having a first sub-pixel region, a second sub-pixel region, and a third sub-pixel region;
    forming a planarization layer to cover the first sub-pixel region, the second sub-pixel region, and the third sub-pixel region, such that a distance between the substrate and a top surface of the planarization layer at a center of the first sub-pixel region is greater than a distance between the substrate and the top surface of the planarization layer at a center of the second sub-pixel region or greater than a distance between the substrate and the top surface of the planarization layer at a center of the third sub-pixel region; and
    forming a first sub-pixel electrode on the planarization layer in the first sub-pixel region, a second sub-pixel electrode on the planarization layer in the second sub-pixel region, and a third sub-pixel electrode on the planarization layer in the third sub-pixel region, wherein
    each of the first, second and third sub-pixel regions has a same stacking of layers between the substrate and the top surface of the planarization layer at the center of the respective first, second or third sub-pixel region.

13. The method of claim 12, further comprising forming a pixel-defining layer (PDL) on the planarization layer and extending over the first sub-pixel region and the second sub-pixel region and over the second sub-pixel region and the third sub-pixel region to cover edges of the first sub-pixel electrode, the second sub-pixel electrode, and the third sub-pixel electrode.

14. The method of claim 13, wherein the forming of the PDL is performed such that a distance between the substrate and a top surface of a portion of the PDL that extends over the first sub-pixel region and the second sub-pixel region so as to cover the edge of the first sub-pixel electrode and the edge of the second sub-pixel electrode is equal to a distance between the substrate and a top surface of a portion of the PDL that extends over the second sub-pixel region and the third sub-pixel region so as to cover the edge of the second sub-pixel electrode and the edge of the third sub-pixel electrode.

15. The method of claim 14, wherein the forming of the PDL is performed such that a distance between the substrate and the top surface of the planarization layer at the center of the first sub-pixel region is greater than a distance between the substrate and the top surface of the planarization layer at an edge of the first sub-pixel region.

16. A method of manufacturing an organic light-emitting display apparatus, the method comprising:
    preparing a substrate having a first sub-pixel region, a second sub-pixel region, and a third sub-pixel region;
    forming a planarization layer to cover the first sub-pixel region, the second sub-pixel region, and the third sub-pixel region, such that a distance between the substrate and a top surface of the planarization layer at a center of the first sub-pixel region is greater than a distance between the substrate and the top surface of the planarization layer at a center of the second sub-pixel region or greater than a distance between the substrate and the top surface of the planarization layer at a center of the third sub-pixel region;
    forming a first sub-pixel electrode on the planarization layer in the first sub-pixel region, a second sub-pixel electrode on the planarization layer in the second sub-pixel region, and a third sub-pixel electrode on the planarization layer in the third sub-pixel region; and
    forming a pixel-defining layer (PDL) on the planarization layer and extending over the first sub-pixel region and the second sub-pixel region and over the second sub-pixel region and the third sub-pixel region to cover edges of the first sub-pixel electrode, the second sub-pixel electrode, and the third sub-pixel electrode,
    wherein the forming of the PDL is performed such that a distance between the substrate and a top surface of a portion of the PDL that extends over the first sub-pixel region and the second sub-pixel region so as to cover the edge of the first sub-pixel electrode and the edge of the second sub-pixel electrode is equal to a distance between the substrate and a top surface of a portion of the PDL that extends over the second sub-pixel region and the third sub-pixel region so as to cover the edge of the second sub-pixel electrode and the edge of the third sub-pixel electrode;
    wherein the forming of the PDL is performed such that a distance between the substrate and the top surface of the planarization layer at the center of the first sub-pixel region is greater than a distance between the substrate and the top surface of the planarization layer at an edge of the first sub-pixel region; and
    wherein the first sub-pixel electrode covers at least a portion of the top surface of the planarization layer at the edge of the first sub-pixel region and covers the top surface of the planarization layer at the center of the first sub-pixel region.

17. The method of claim 16, wherein the forming of the PDL is performed such that the portion of the PDL that extends over the first sub-pixel region and the second sub-pixel region covers a portion of the first sub-pixel electrode at the edge of the first sub-pixel region.

18. The method of claim 16, further comprising:
    forming a second emission layer (second EML) on the top surface of the portion of the PDL that extends over the first sub-pixel region and the second sub-pixel region, on at least a portion of the second sub-pixel electrode that is not covered by the PDL, and on the top surface of the portion of the PDL that extends over the second sub-pixel region and the third sub-pixel region; and
    forming a first EML on a top surface of the second EML on the top surface of the portion of the PDL that extends over the first sub-pixel region and the second sub-pixel region, on at least a portion of the first sub-pixel electrode that is not covered by the PDL, and on a top surface of the second EML on the top surface of the portion of the PDL that extends over the second sub-pixel region and the third sub-pixel region.

19. The method of claim 18, wherein a step difference between a top surface of the second EML on the portion of the PDL that extends over the first sub-pixel region and the second sub-pixel region and a top surface of the center of the first sub-pixel electrode is equal to a step difference between a bottom surface of the second EML on the portion of the PDL that extends over the first sub-pixel region and the second sub-pixel region and a top surface of the center of the second sub-pixel electrode.

20. The method of claim 18, further comprising forming a third EML to cover a portion of the first sub-pixel electrode that is not covered by the PDL, a portion of the second sub-pixel electrode that is not covered by the PDL, a portion of the third sub-pixel electrode that is not covered by the PDL, and the top surface of the PDL.

* * * * *